(12) United States Patent
Shinomiya et al.

(10) Patent No.: US 6,330,707 B1
(45) Date of Patent: Dec. 11, 2001

(54) AUTOMATIC ROUTING METHOD

(75) Inventors: Noriko Shinomiya; Masahiro Fukui, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/157,387

(22) Filed: Sep. 21, 1998

(30) Foreign Application Priority Data

Sep. 29, 1997 (JP) .................................................. 9-263958
Sep. 29, 1997 (JP) .................................................. 9-263978

(51) Int. Cl.$^7$ .................................................. G06F 17/50
(52) U.S. Cl. .................. 716/14; 716/12; 716/13; 716/21
(58) Field of Search ........................... 716/14, 13

(56) References Cited

U.S. PATENT DOCUMENTS

| | | | |
|---|---|---|---|
| 4,615,011 | * 9/1986 | Linsker | 364/491 |
| 5,224,057 | * 6/1993 | Igarashi et al. | 364/490 |
| 5,315,535 | * 5/1994 | Kikuchi et al. | 364/490 |
| 5,461,576 | * 10/1995 | Tsay et al. | 364/490 |
| 5,729,469 | * 3/1998 | Kawakami | 364/490 |
| 5,790,414 | * 8/1998 | Okano et al. | 364/488 |
| 5,852,562 | * 12/1998 | Shinomiya et al. | 364/491 |
| 5,867,398 | * 2/1999 | Scepanovic et al. | 364/489 |
| 5,889,681 | * 3/1999 | Suda | 364/491 |
| 5,930,500 | * 7/1999 | Scepanovic et al. | 395/500.14 |
| 5,943,486 | * 8/1999 | Fukui et al. | 395/500.1 |
| 6,011,912 | * 1/2000 | Yui et al. | 395/500.14 |
| 6,014,507 | * 1/2000 | Fujii | 395/500.13 |
| 6,067,409 | * 5/2000 | Scepanovic et al. | 395/500.09 |

OTHER PUBLICATIONS

Youn–Long Lin et al., "A Detailed Router Based On Simulated Evolution", Proc. of International Conference on Computer Aided Design, pp. 38–41, 1988.

F. Rubin, "The Lee Path Connection Algorithm", IEEE Transactions on Computers, vol. c–23, No. 9, pp. 907–914, Sep. 1974.

K. Roy–Neogi et al., Multiple FPGA Partitioning with Performance Optimization, International Symposium on Field Programmable Gate Arrays, pp. 146–152, Feb. 1995.*

H.–J. Jang et al., A Grid–based Approach for Connectivity Binding with Geometric Coast, IEEE/ACM International Conference on Computer–Aided Design, pp. 94–99, Nov. 1993.*

Z. Moosa et al., An investigation of Iterative Routing Algorithms, Proceedings of the 1995 Design Automation Conference, pp. 91–96, Sep. 1995.*

(List continued on next page.)

Primary Examiner—Matthew Smith
Assistant Examiner—A. M. Thompson
(74) Attorney, Agent, or Firm—Eric J. Robinson; Nixon Peabody LLP

(57) ABSTRACT

First, initial routing is performed on a net. If a design rule error exists in a wire already routed as a result of the initial routing, the wire already routed, causing the design rule error, is removed. Next, if the wire already routed and removed is a wire interconnecting a movable terminal, freely placeable within a predetermined region, to another terminal, then the movable terminal is displaced within the predetermined region and the removed wire is re-routed such that the displaced movable terminal is interconnected to the other terminal. Accordingly, the movable terminal can be located at an appropriate position within the predetermined region in accordance with the situation of surrounding wires. As a result, routing results of a higher density can be obtained.

13 Claims, 28 Drawing Sheets

OTHER PUBLICATIONS

J. Criado et al., CANAL: An efficient Program for Channel Routing, Mediterranean Electrochemical Conference, pp. 320–323, Apr. 1989.*

D. Theune et al., HERO: Hierarchical EMC–constrained Routing, 1992 IEE/ACM International Conference on Computer–Aided Design, pp. 468–472, Nov. 1992.*

J. Soukup, Maze Router Without a Grid Map, 1992 IEEE/ACM International Conference on Computer–Aided Design, pp. 382–385, Nov. 1992.*

K. –F. Liao et al., Boundary Single–Layer Routing with Movable Terminals, Computer–Aided Design of Integrated Circuits, pp. 1382–1391, Nov. 1991.*

K. –E. Chang, Efficient Algorithms of Wiring Channels With Movable Terminals, IEEE Transactions on Computer–Aided Design of Integrated Circuits adn Systems, pp. 1059–1063, Jul. 1993.*

Y.–L. Lin et al., SILK: A Simulated–Evolution Router, IEEE Transactions on Computer–Aided Design of Integrated Circuits and Systems, pp. 1108–1114, Oct. 1989.*

Youn–Long Lin et al., A Detailed Router Based on Simulated Evolution, IEEE International Conference on Computer–Aided Design, pp. 38–41, Nov. 1988.*

E.P. Huijbregts et al., On Design Rule Correct Maze Routing, European Design and Test Conference, pp. 407–411, Feb. 1994.*

J. Lienig et al., Routing Algorithms for Multi–Chip Modules, European Design Automation Conference, pp. 286–291, Sep. 1992.*

M. Mogaki et al., A Layout Improvement Method Based on Constraint Propagation for Analog LSI's, pp. 510–513, Jun. 1991.*

Le–Chin Liu et al., Chip–level Area Routing, 1998 International Symposium on Physical Design, pp. 197–204, Apr. 1998.*

H. Keshk et al., Amon: A Parallel Slice Algorithm for Wire Routing, Proceedings of the 9th ACM International Conference on Supercomputing, pp. 200–208, Jul. 1995.*

J. Huang et al., An Efficient Timing–driven Global Routing Algorithm, Proceedings of the 30th International Conference on Design Automation, pp. 596–600, Jun. 1993.*

W.K. Luk et al., Hierarchical Global Wiring for Custom Chip Design, Proceedings of the 23rd ACM/IEEE Conference on Design Automation, pp. 481–489, Jun. 1986.*

Hsiao–Pin Su et al., A Timing–Driven Soft–Macro Placement and Resynthesis Method In Interaction with Chip Floorplanning, IEEE Transactions on Computer–Aided Design of Integrated Circuits and Systems, pp. 475–483, Apr. 1999.*

H. Shirota et al., A New Ript–up and Reroute Algorithm for Very Large Scale Gate Arrays, IEEE 1996 Custom Integrated Circuits Conference, pp. 171–174, May 1996.*

Ping–San Tzeng et al., Codar: A Congestion–Directed General Area Router, IEEE International Conference on Computer–Aided Design, pp. 30–33, Nov. 1988.*

* cited by examiner

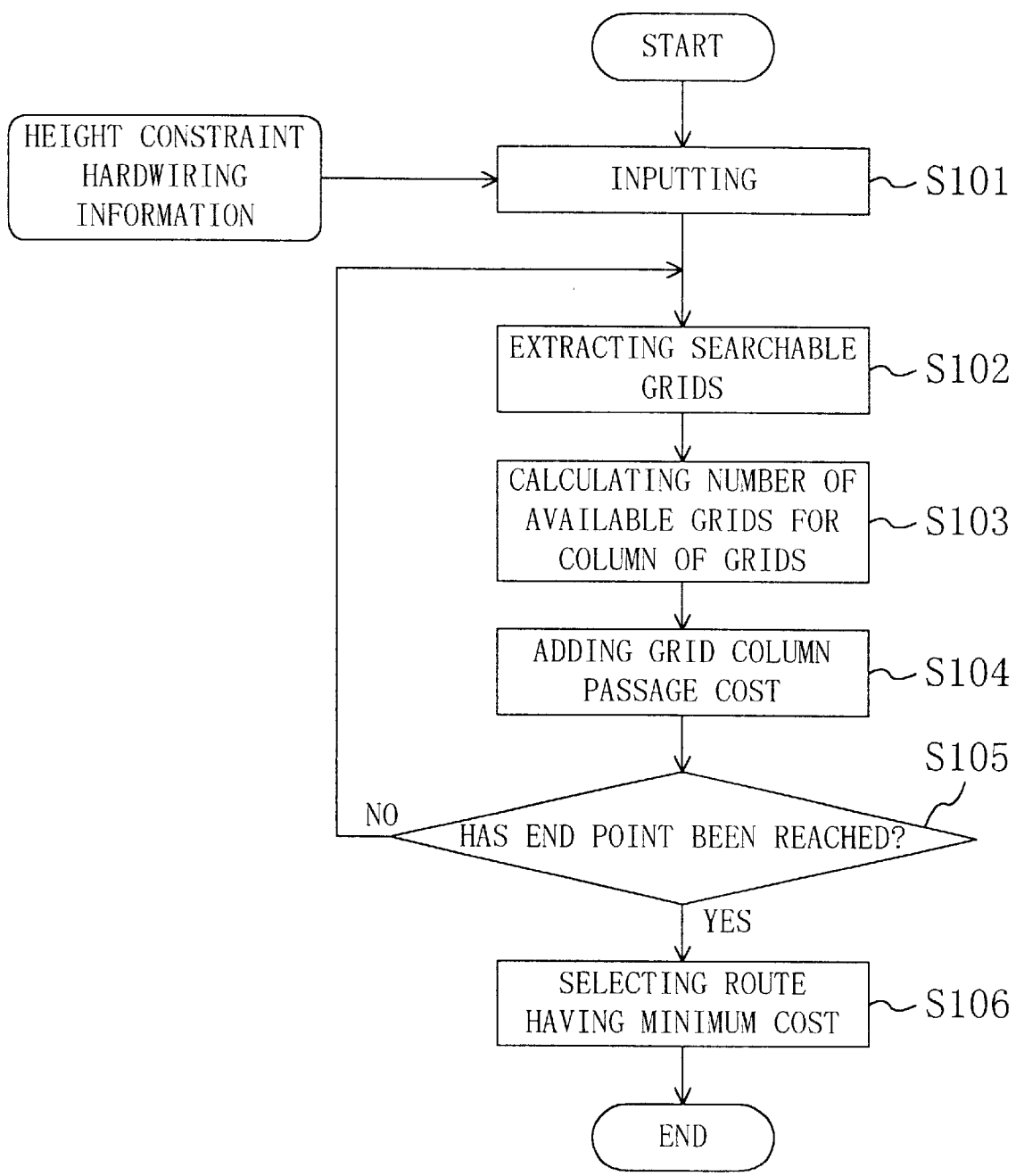

| GRID COLUMN NO. | 1 | 2 | 3 | 4 | 5 | 6 | 7 | 8 | 9 | 10 | 11 |
|---|---|---|---|---|---|---|---|---|---|---|---|
| NO. OF AVAILABLE GRIDS | 4 | 4 | 4 | 4 | 3 | 0 | 0 | 1 | 3 | 1 | 4 |
| GRID COLUMN PASSAGE COST | 0 | 0 | 0 | 0 | 0 | 100 | 100 | 0 | 0 | 0 | 0 |

FIRST WIRING LAYER

SECOND WIRING LAYER

AUTOMATIC ROUTING METHOD

BACKGROUND OF THE INVENTION

The present invention generally relates to an improved automatic routing method utilized for designing an LSI through routing. More particularly, the present invention relates to an improved routing method for eliminating design rule errors by removing/re-routing and to an improved method for searching for wiring routes. Specifically, the present invention searches for wiring routes by applying a maze algorithm to a wiring region divided into a plurality of grids. In particular, the method of the present invention is adapted to search for a wiring route satisfying a constraint applied on the height or the lateral width of a wiring region irrespective of the number of grids of the wiring region.

Removing/re-routing is a conventionally known routing method attaining satisfactory results. In accordance with this re-routing method, if one of the wires already routed prevents a predetermined net from being routed, then the wire is removed, the predetermined net is routed and the wire removed is re-routed.

Such a re-routing method is disclosed, for example, by Youn-Long Lin et al., "A Detailed Router Based on Simulated Evolution", 1988 International Conference on Computer Aided Design, in which design rule errors (i.e., short-circuit of a wire) resulted from initial routing is eliminated by removing/re-routing. Hereinafter, the processing procedure of this conventional method will be described.

First, in order to meet a given hardwiring request, initial routing is performed independently on respective nets. That is to say, wiring routes are once determined without taking design rule errors caused with other wiring routes into consideration. In the above-described document, initial routing is carried out in accordance with a greedy algorithm by moving a column from left to right.

Next, if no design rule errors exist in any of the currently routed wires, then it is determined that the routing process should end. However, if any obstructive wire causing a design rule error exists, then the wire is extracted as a wire to be removed. Specifically, this extraction step is performed in the following manner.

First, the score of a net is evaluated by the following Equation 1:

Score of net=$a$×(number of design rule errors)+$b$×(number of contacts−number of terminals)+$c$×(real wire length/estimated wire length)  (1)

(where a, b and c are parameters)
the "estimated wire length" is herein equal to one half of the entire peripheral length of a minimum rectangle surrounding a plurality of terminals to be interconnected.

Thereafter, it is determined based on a comparison between the score of a net and a random number whether or not the net should be removed. For example, if the net has a score larger than the random number, then the net is extracted as a wire to be removed.

Subsequently, the extracted wire is removed, a target net is routed and then the wire removed is re-routed.

On the other hand, a maze algorithm has conventionally been used for searching for a route interconnecting a plurality of terminals. Such a maze algorithm is disclosed, for example, by Frank Rubin et al., "The Lee Path Connection Algorithm", 1974 IEEE Transactions on Computers, Vol. c-23, No.9. In accordance with this maze algorithm, a wiring route cost given by the following Equation 2 is used:

Wiring route cost=$a$×(wire length)+$b$×(number of contacts)+$c$×(number of design rule errors)  (2)

(where a, b and c are also parameters)
If a cost regarding a design rule error is defined for a wiring route cost in accordance with Equation 2, then the design rule errors can be gradually eliminated by repeatedly performing removing/re-routing.

In recent years, in order to enhance the performance of a MOSFET, fabrication technologies for reducing the diffusion resistance of the MOSFET by utilizing silicide and/or salicide process techniques have been commonly used. Before such fabrication technologies were developed, source/drain electrodes 81 and 82 of a conventional MOSFET with high diffusion resistance shown in FIG. 9(*a*), including gate, source and drain electrodes 80, 81 and 82, had to be extended as metal wires 71 from a diffusion region 70 via a large number of contacts 72. However, since the diffusion resistance of a MOSFET is reduced by utilizing such fabrication technologies, the number of contacts 72 in the source/drain electrodes 81 and 82 can be considerably reduced as shown in FIG. 9(*b*). Thus, as can be understood from FIG. 9(*b*), source/drain terminals 71A and 71B, each having a small number (e.g., one in FIG. 9(*b*)) of contacts 72, may be formed at any arbitrary positions in the source/drain regions.

The present inventors carried out intensive analysis on an automatic routing/designing method of an LSI, in view of such progress in fabrication technologies. And we paid special attention to the fact that if the positions of the source/drain terminals 71A and 71B are appropriately moved within the source/drain regions, then a metal wire 71C can be placed over a part of the diffusion region 70 where the source/drain terminals 71A and 71B are not placed as shown in FIG. 9(*b*). From this point of view, we found that if the presence of freely movable terminals within a certain region is taken into consideration and if the freely movable terminals are appropriately placed in accordance with the situations of surrounding wires, then high-density routing results can be obtained.

However, according to the conventional removing/re-routing method, the positions of terminals are fixed and therefore cannot be appropriately moved in accordance with the situations of wires.

An exemplary conventional method for searching for wiring routes in accordance with the maze algorithm as disclosed by Frank Rubin et al. in the above-identified document will be described with reference to the flow chart illustrated in FIG. 24.

First, in Step S10, hardwiring information is input. Next, in Step S20, currently searchable grids are extracted. Searchable grids adjacent to a grid in a list L, i.e., available grids other than grids specified as being located in a wiring forbidden region and grids in which terminals are located, are put into a list L1. At the same time, search directions from the grid in the list L to the respective searchable grids are saved. The grids in the list L1 are extracted as searchable grids.

Then, in Step S40, wire length costs are added while the searchable grids, extracted in Step S20, are being searched for. Every time one grid is passed, a wire length cost of "1" is added. Next, a particular grid having a minimum cost is selected from the grids in the list L1 and inserted into the list L.

Subsequently, in Step S50, it is determined whether or not an end point has been reached. If the end point has been reached, then the process advances to the next step. Otherwise, the process returns to Step S20. In other words, if a grid to be reached is included among the grids in the list L, then the process advances to the next Step S60 of selecting a route having a minimum cost. Otherwise, the process returns to Step S20.

In Step S60, a wiring route having a minimum cost is extracted by tracing back the route using the search directions saved in Step S20.

Hereinafter, this process will be described in more detail with reference to FIG. 25. Herein, the number of wiring layers is assumed to be one for the sake of simplicity. A wiring region 20 is divided into a large number of grids 30. In the wiring region 20, terminals 10A, 10a, 10B, 10b, 10C and 10c and a wiring forbidden region 21 are present.

In Step S10, hardwiring information is input. The numerals of the terminals 10A, 10a, 10B, 10b, 10C and 10c denote the number of respective nets and a pair of terminals having the same number (e.g., the terminals 10A and 10a) should be hardwired to each other.

A case of routing Net 1 will be described. The start point of Net 1 is the terminal 10A and the end point thereof is the terminal 10a. In Step S20, the grid where the start point 10A is placed is first put into the list L. Then, searchable grids adjacent to the start point 10A are put into the list L1. In this example, four grids vertically and horizontally adjacent to the start point 10A are put into the list L1. At the same time, the search directions indicated by the arrows in FIG. 25 are saved. And the four grids in the list L1 are extracted as searchable grids.

Next, in Step S40, every time a single grid has been passed, a wire length cost of "1" is added.

Then, at least one grid having a minimum cost is/are selected from the list L1 and inserted into the list L. Since all of the four grids currently present in the list L1 have the same cost of "1", all these four grids are inserted into the list L.

Subsequently, if it is determined that the end point grid 10a has not been reached yet in Step S50, then the process returns to Step S20. Thereafter, until the end point grid 10a is reached, the same processing steps S20, S40 and S50 are repeatedly performed.

In FIG. 25, the numbers in respective grids represent the results obtained by adding the wire length costs.

If it is determined in Step S50 that the end point grid 10a is included in the list L after the same steps have been repeatedly performed several times, then the search direction represented by the arrows in FIG. 25 is traced back from the end point grid 10a in Step S60, thereby extracting a wiring route 40 having a minimum cost.

The routing results are illustrated in FIG. 26(a). FIG. 26(b) illustrates the results obtained by compacting downward the wires shown in FIG. 26(a). By performing compaction, not only wires but also terminals and a wiring forbidden region can be moved downward if there are vacant spaces. Thus, the terminals 10A and 10c have been moved downward.

In accordance with a conventional method for searching for wiring routes, if routing is performed in a wiring region divided into a number of grids and if the number is not sufficiently large, then wires already routed sometimes prevent routing. Thus, in order to complete routing, grids should be added from an initial stage or after it is determined that routing cannot be completed and thereby a sufficient number of grids should be secured.

However, if some constraint on height or lateral width is given to a wiring region, the constraint sometimes cannot be satisfied because of such posterior insertion of additional grids. An exemplary case will be described with reference to FIGS. 27 through 29. In the following description, a method for routing and designing a standard cell, applicable to designing an ASIC, will be exemplified.

In FIGS. 27 through 29, a height constraint 101 is ordinarily given to a standard cell 100. In the cell 100, transistors 50A, 50B, terminals 10 and power supply lines 60 are present. Herein, even though the cell actually has a multi-layer wiring structure, only wires in the first layer (a first metal wiring layer 71 for a standard cell) are illustrated for the sake of simplicity.

In FIG. 27, a grid gap 32 is defined by uniformly dividing the cell by the routing pitch of the first wiring layer 71. If maze routing is completed on the grids having a uniform routing pitch, then the height constraint on a cell can be automatically satisfied. In other words, in order to complete routing between the transistors 50A and 50B, a gap corresponding to the wires passing therethrough should be provided beforehand between the transistors.

However, it is very difficult to precisely estimate the gap before the routing is performed. In actuality, during routing and designing manually, trials and errors are inevitable for routing wires and adjusting the gap between transistors simultaneously.

For example, if the gap between the transistors 50A and 50B, obtained by pre-routing estimation, is too narrow as shown in FIG. 28, then routing fails or cannot be completed because of the shortage in number of grids. As can be seen, the terminals 10A and 10B cannot be routed because of the shortage in number of grids.

In order to solve such a problem, in accordance with a conventional method, grids having a height narrower than the routing pitch, i.e., grids having a gap 32B narrower than an ordinary gap 32A, are provided between the transistors 50A and 50B as shown in FIG. 29, thereby completing routing. Thereafter, the gap between the transistors and the gap between the wires are modified through compaction, thereby obtaining the same results as those illustrated in FIG. 27.

However, if such grids as having the narrower gap 32B are inserted as shown in FIG. 29, then the number of grids in the height direction increases. Thus, in accordance with such a conventional wiring route search method involving the insertion of narrower grids, the height constraint on the cell 100 cannot be satisfied. In the foregoing example, a case where a height constraint cannot be satisfied has been described. A similar problem happens in the same way when a constraint is given on a lateral width.

SUMMARY OF THE INVENTION

The first object of the present invention is appropriately placing freely movable terminals in accordance with the situations of surrounding wires and thereby obtaining routing results with a higher density for an automatic routing method.

The second object of the present invention is providing a wiring route search method that can always satisfy a constraint given on height and/or lateral width of a wiring region irrespective of the number of grids included in the wiring region.

In order to accomplish the first object, according to the present invention, the positions of the freely movable terminals are appropriately modified and moved in accordance with the situations of surrounding wires while removing/re-routing is being performed.

And in order to accomplish the second object, the present invention sets a passage cost as a cost required by a maze algorithm for a column of grids having a height constraint or a row of grids having a lateral width constraint based on the number of available grids, and adds the passage cost to a wiring route cost.

The automatic routing method of the present invention is a method for routing and designing an LSI. The method includes the steps of: a) initial routing of a net; b) removing a wire, which has already been routed and causes a design rule error or a non-routable wire, if the design rule error exists in the wire or the non-routable wire is caused as a result of the step a); and if the wire already routed and removed during the step b) is a wire interconnecting a movable terminal, freely placeable within a predetermined region, to another terminal, c) displacing the movable terminal within the pre-determined region and re-routing the removed wire such that the displaced movable terminal is interconnected to the another terminal.

In one embodiment of the present invention, the step a) may include the steps of: d) defining the predetermined region where the movable terminal is placeable; and e) determining an initial position of the movable terminal in the defined, predetermined region.

In another embodiment of the present invention, in the step b), the wire already routed and to be removed is extracted by regarding the number of the movable terminals as an index of evaluation.

In the method of the present invention for searching for a wiring route during automatically routing and designing an LSI, the wiring route is searched for in accordance with a maze algorithm in which a wiring route cost is calculated by adding a cost every time a single grid is passed in a wiring region divided into a plurality of grids. The method includes the steps of: a) inputting at least one of a height constraint and a lateral width constraint of the wiring region and hardwiring information; b) calculating a number of available grids for each column of grids, on which the height constraint of the wiring region is applied, or each row of grids, on which the lateral width constraint of the wiring region is applied, during routing based on the hardwiring information; and c) setting a passage cost for one of the columns of grids or one of the rows of grids, to which column or row the wiring route to be searched for proceeds, based on the number of available grids calculated for the column or the row, and adding the passage cost to the wiring route cost.

In one embodiment of the present invention, in the step b), the number of available grids is calculated by subtracting a size of a wiring forbidden region in each said column or row of grids and a total size of wires already assigned to the column or row of grids from the height or lateral width constraint of the wiring region.

In another embodiment of the present invention, in the step c), the passage cost is set based on not only the number of available grids but also a penalty for failing to satisfy the height or lateral width constraint.

In still another embodiment, the method further includes the steps of: e) repeatedly searching for the wiring route if the height or lateral width constraint of the wiring region has not still been satisfied after all the routes have been searched for; and f) changing the penalty for failing to satisfy the height or lateral width constraint every time the wiring route is repeatedly searched for.

In accordance with the automatic routing method of the present invention, a wire already routed, causing design rule error or a non-routable wire, is removed. Thereafter, if the removed wire already routed has a movable terminal during re-routing the removed wire, then the position of the movable terminal is appropriately modified, moved and re-routed simultaneously. As a result of re-routing of the removed wire, a wire satisfying the design rule and having a shortest wire length can be obtained, and the position of the movable terminal on the route is an optimum position. Consequently, a large number of nets can be routed with a higher density.

In particular, according to the present invention, since the removed wire is extracted by regarding the number of movable terminals as an index of evaluation, a wire having a movable terminal is more likely to be extracted as a wire already routed and to be removed. Since it is highly probable to find another route having a shorter wire length for such a wire having a movable terminal by displacing the movable terminal, the routing results can be of an even higher density.

Also, in accordance with the method of the present invention for searching for a wiring route during automatic routing and designing, a wiring route, which is more likely to fail to satisfy the height or lateral width constraint of a wiring region, has a smaller number of available grids, a higher passage cost and a higher wiring route cost. On the other hand, a wiring route, which is less likely to fail to satisfy the constraint, has a larger number of available grids, a lower passage cost and a lower wiring route cost. Thus, if a wiring route having a lower wiring route cost is selected, then the height or lateral width constraint of a wiring region can be satisfied irrespective of the number of grids included in the wiring region.

In particular, according to the present invention, if the height or lateral width constraint of a wiring region is still not satisfied after all the routes have been searched for, then the route is repeatedly searched for by gradually increasing the penalty for failing to satisfy the height or lateral width constraint until the constraint is met. Thus, the route of a wire having the largest wiring route cost of all the wires can be changed into the route of another wire having a smaller wiring route cost. Accordingly, the height or lateral width constraint on a wiring region can be satisfied substantially without depending on the order of routing.

BRIEF DESCRIPTION OF THE DRAWINGS

FIG. 10 is a flow chart illustrating the processing procedure of a wiring route search method in the third embodiment of the present invention.

FIGS. 11(a) and 11(b) are a diagram and a table for illustrating how the number of available grids is calculated for a column of grids in accordance with the wiring route search method of the third embodiment.

DETAILED DESCRIPTION OF THE INVENTION

Hereinafter, the preferred embodiments of the present invention will be described with reference to the accompanying drawings.

Embodiment 1

Figure 1:
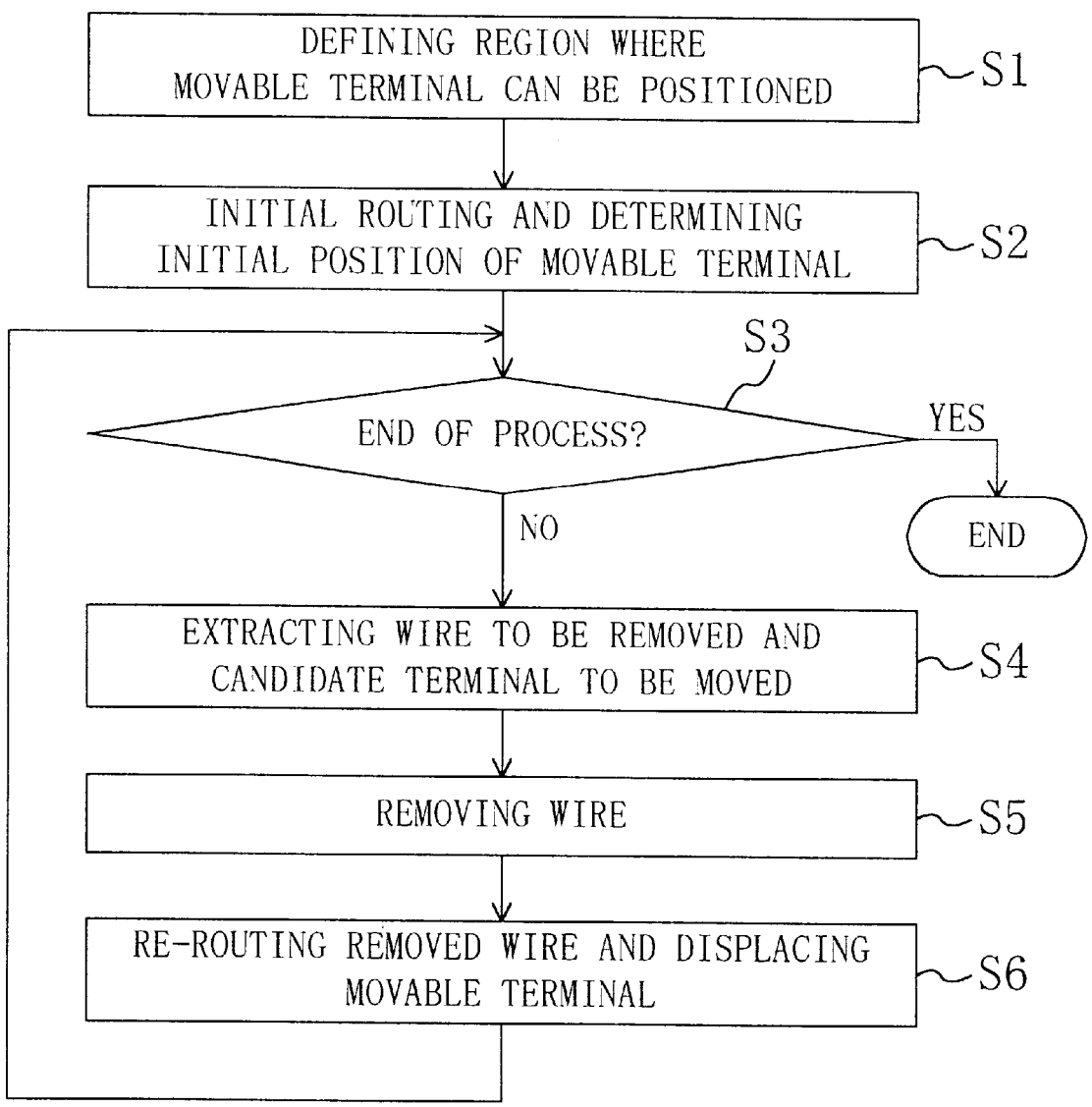
FIG. 1 is a flow chart illustrating the processing procedure of an automatic routing method in the first embodiment of the present invention.

FIG. 1 is a flow chart illustrating the processing procedure of an automatic routing method in the first embodiment of the present invention. An automatic routing program, illustrated by this flow chart, is stored in a computer readable storage medium and used for routing and designing an LSI by a computer.

In FIG. 1, in Step S1, a predetermined region, where a freely placeable terminal (hereinafter, such a terminal will be called a "movable terminal") can be positioned, is defined. In this embodiment, the number of wiring layers is assumed to be one for the sake of simplicity. This Step S1 will be described in detail with reference to FIG. 2.

Figure 2:
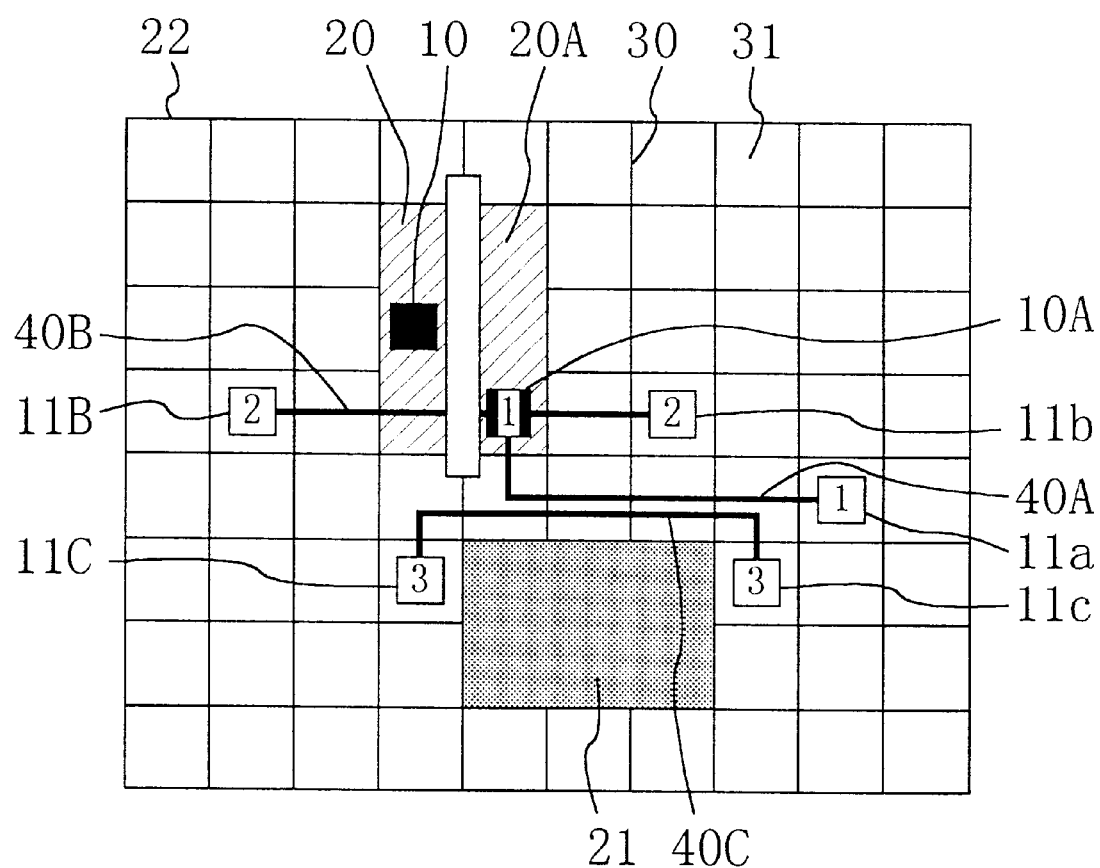
FIG. 2 is a diagram illustrating the results of initial routing in accordance with the automatic routing method of the first embodiment.

As shown in FIG. 2, a wiring region 22 is divided into a large number of grids 31 with a plurality of grid lines 30. Terminals include movable terminals 10, 10A and fixed terminals 11a, 11B, 11b, 11C and 11c. The numerals in the respective terminals denote the numbers of nets. Net 1 includes the movable terminal 10A and the fixed terminal 11a. The movable terminal 10A has a size corresponding to one grid. And a movable terminal placeable region 20A, having a height corresponding to three vertical grids, is defined. Herein, it is assumed that the movable terminal 10A is freely placeable within the movable terminal placeable region 20A. In routing and designing at a transistor level, the movable terminal corresponds to a source/drain terminal of a MOSFET, while the movable terminal placeable region 20A corresponds to a source/drain region. The fixed terminal herein means a non-movable terminal, e.g., a gate terminal or a power supply terminal. Net 2 includes the fixed terminals 11B and 11b, and Net 3 includes the fixed terminals 11C and 11c. In FIG. 2, a wiring forbidden region 21 exists.

In FIG. 1, in Step S2, initial routing is performed and the initial positions of the movable terminals are determined (corresponding to the steps of determining an initial position and initial routing). In the step of initial routing, respective nets are routed independently in response to a given hard-wiring request as in the conventional method. That is to say, wiring routes are determined without taking design rule errors with other wiring routes into consideration. Nevertheless, only intersection and overlap of wires and intersection between a movable terminal and a wire are allowed as design rule errors in this embodiment. Thus, no design rule error is allowed for the fixed terminals and the wiring forbidden region.

In the step of initial routing, a route having a minimum cost is searched for in accordance with the maze search method described in the Background section.

A wiring route cost used for initial routing is given, for example, by the following Equation 3:

$$\text{Wiring route cost} = a \times (\text{wire length}) \quad (3)$$

(where a is a parameter)

A step of obtaining an initial wiring route for Net 1 including the movable terminal 10A and the fixed terminal 11a shown in FIG. 2 will be described with reference to FIG. 3.

Figure 3:
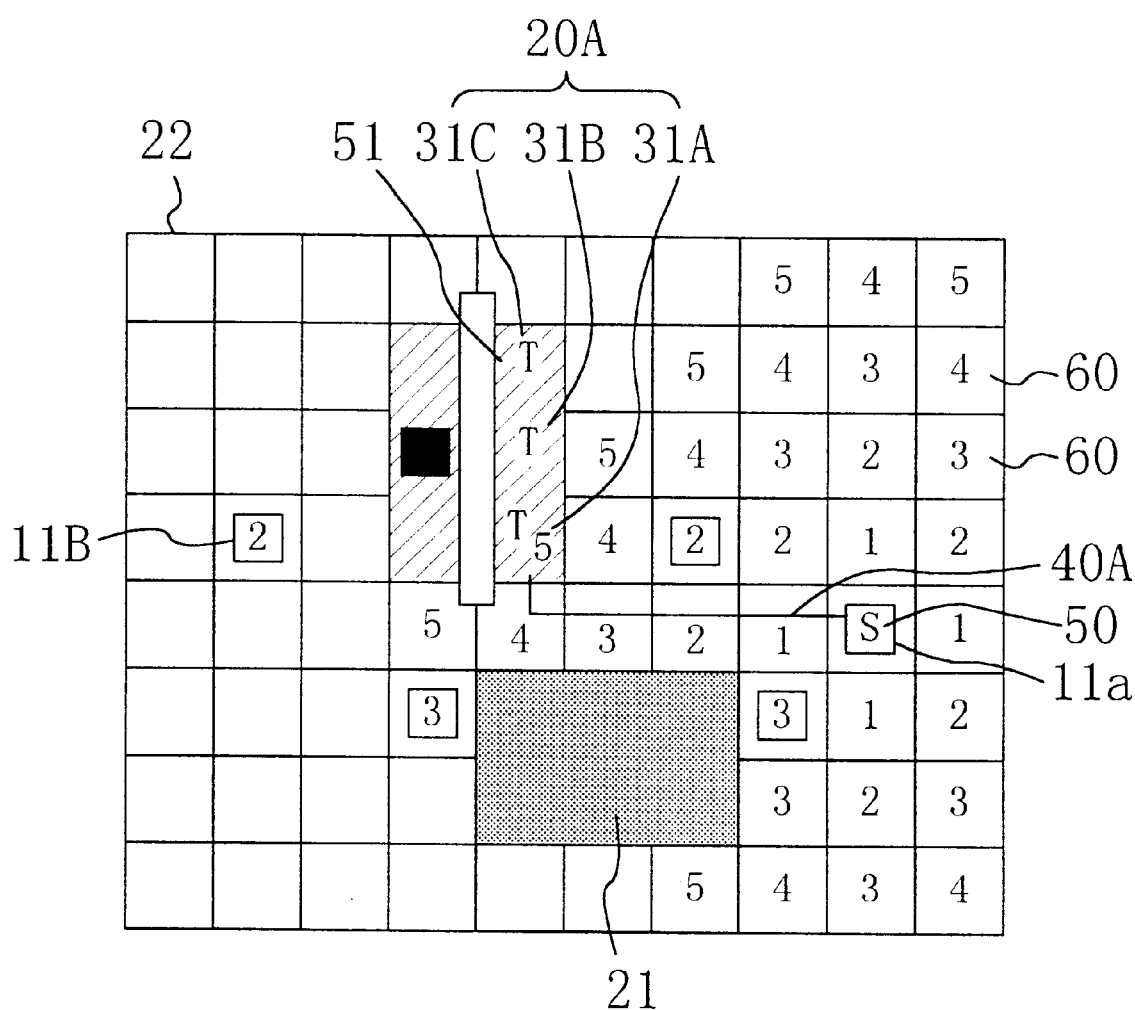
FIG. 3 is a diagram illustrating an intermediate stage of the initial routing in accordance with the automatic routing method of the first embodiment.

As shown in FIG. 3, the fixed terminal 11a is marked by a start point mark 50 (S), and three grids 31A, 31B and 31C located in the movable terminal placeable region 20A for the movable terminal 10A are marked by end point marks 51 (T). The numbers 1 to 5 in the grids surrounding the start point mark 50 (S) denote costs 60 taken to reach the respective grids from the grid marked by the start point mark 50 (S) through maze searching. As a result of this maze searching, it can be understood that the grid 31A out of the three grids marked by the end point marks 51 (T) can be reached with a minimum cost of "5" via a wiring route 40A. Thus, the wiring route 40A is determined as the initial route of Net 1 and the grid 31A is determined as the initial position of the movable terminal 10A.

Next, Net 2 including the two fixed terminals 11B and 11b is routed. As described above, during initial routing, the design rule error is allowed while obtaining a route having a minimum cost. Accordingly, a wiring route 40B passing the grid 31A, which is the initial position of the movable terminal 10A, is obtained as shown in FIGS. 2 and 3.

Subsequently, Net 3 including the two fixed terminals 11C and 11c is routed. As a result, a wiring route 40C is determined as shown in FIG. 2.

In FIG. 1, in Step S3, it is determined that the routing process should end if no design rule error exists in the current wires and if no non-routable net exists. In this embodiment, the movable terminal 10A overlaps with the wiring route 40B between Nets 1 and 2, and the wiring routes 40A and 40C overlap with each other between Nets 1 and 3. Since these design rule errors exist, the process should not end and proceeds to the next step S4.

In FIG. 1, in the next Step S4, obstructive wires and movable terminals, causing design rule errors, are extracted. Specifically, first, the scores of the respective nets are evaluated. In this embodiment, the scores are determined in accordance with the following Equation 4:

$$\text{Score of net} = a \times (\text{number of design rule errors}) + b \times (\text{real wire length/estimated wire length}) + c \times (\text{number of movable terminals}) \quad (4)$$

(where a, b and c are parameters)

The first and second terms on the right side of Equation 4 are scores used in the conventional method. The first term is used for making a net having a larger number of design rule errors easier to remove. On the other hand, the second term is provided based on the prediction that another route is more likely to be found for the more detouring wire. And the third term is characteristic of the present invention and used for evaluating the score of a net by using the number of movable terminals as an index of evaluation. Specifically, the number of movable terminals is multiplied by the parameter c based on the prediction that another route is more likely to be found as the number of movable terminals existing for a net increases.

The scores of Nets 1 to 3 in FIG. 2 are calculated as follows. In this example, a, b and c are assumed to be 10, 10 and 3, respectively.

Score of Net 1 = $a \times 5 + b \times (5/5) + c \times 1 = 63$

Score of Net 2 = $a \times 1 + b \times (6/6) + c \times 0 = 20$

Score of Net 3 = $a \times 4 + b \times (7/5) + c \times 1 = 54$

It is determined in the same way as the conventional method whether or not a net should be removed. As a result, only Net 1 having the maximum score is extracted as a wire to be removed.

Subsequently, if there is any movable terminal in the net extracted as the wire to be removed, then the movable terminal is extracted as a candidate terminal to be moved. In this example, since Net 1 as the wire to be removed has the movable terminal 10A, the terminal 10A is extracted as a candidate terminal to be moved.

In FIG. 1, Step S5 of removing a wire is performed in the same way as the conventional method.

Next, in Step S6, the removed wire is re-routed and the candidate terminal to be moved is displaced (corresponding to the steps of displacing a movable terminal and re-routing), and the process returns to Step S3. This Step S6 will be described with reference to FIG. 4.

Figure 4:
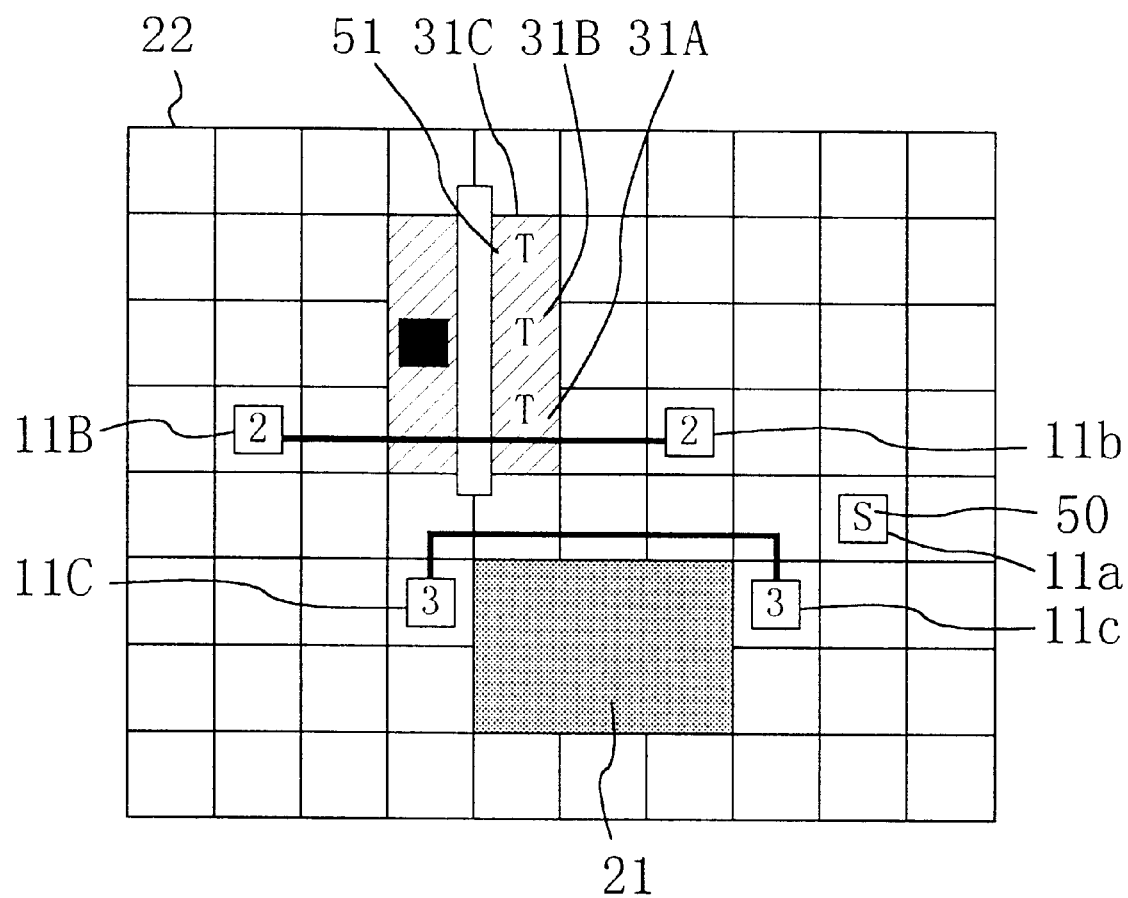
FIG. 4 is a diagram illustrating a preparatory stage of re-routing in accordance with the automatic routing method of the first embodiment.

In FIG. 4, the removed Net 1 is re-routed. The movable terminal 10A belonging to Net 1 has had the initial position thereof defined at the grid 31A in Step S2. However, the movable terminal 10A has also been extracted as a candidate terminal to be moved in Step S4. Thus, the current position of the movable terminal 10A is invalidated, an optimum position is re-selected for the terminal 10A from the movable terminal placeable region 20A and then Net 1 is re-routed based on the optimum position to which the movable terminal has been moved. This re-routing processing step is performed in the following manner.

First, the fixed terminal 11a is marked by a start point mark 50 (S). Next, the three grids 31A, 31B and 31C located in the movable terminal placeable region 20A for the movable terminal 10A are marked by end point marks 51 (T).

Then, in accordance with the maze search method described in the Background section, a route having a minimum cost is searched for.

A wiring route cost used for re-routing is given by the following Equation 5:

$$\text{Wiring route cost} = a \times (\text{wire length}) + b \times (\text{number of design rule errors}) \quad (5)$$

(where a and b are parameters)

Figure 5:
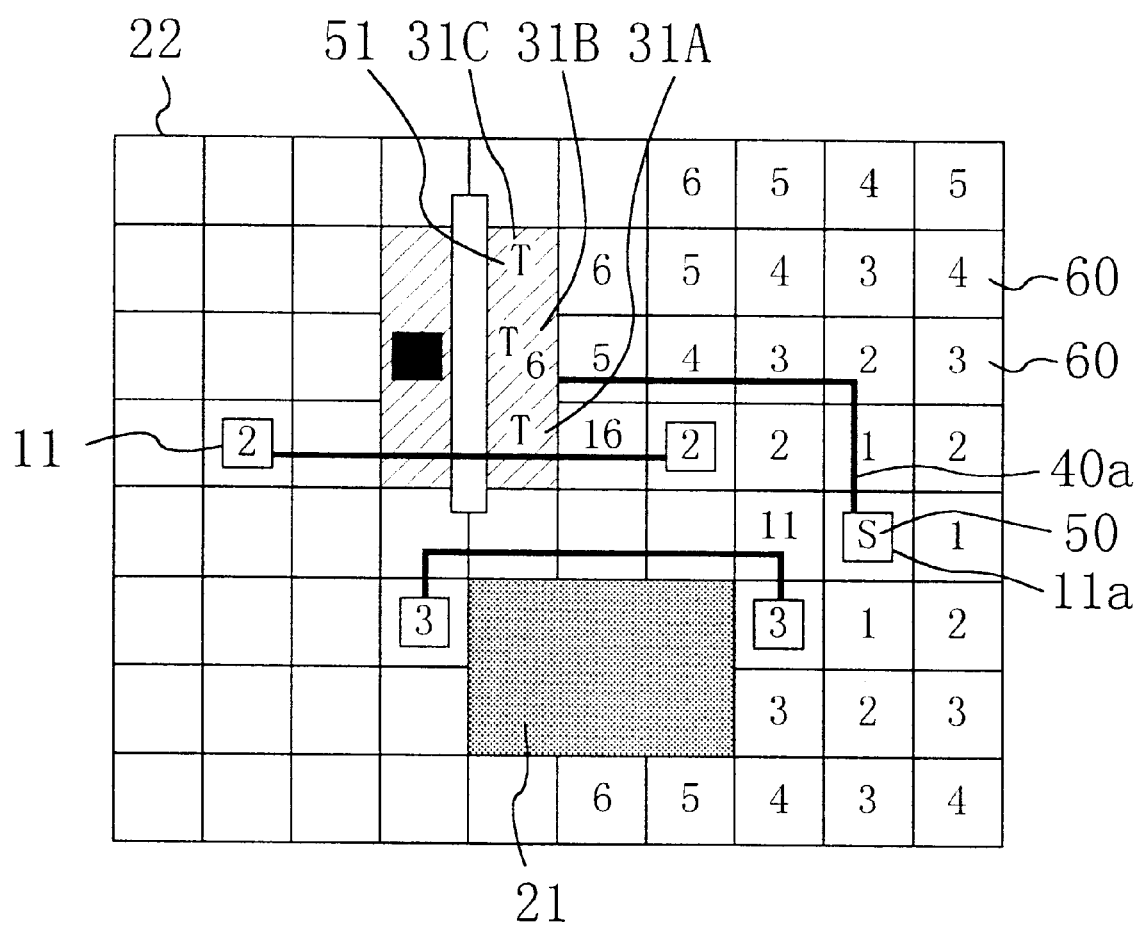
FIG. 5 is a diagram illustrating an intermediate stage of the re-routing in accordance with the automatic routing method of the first embodiment.

The costs taken to reach the respective grids in accordance with the maze search method (where a=1 and b=10) are shown in FIG. 5.

As a result of this maze search, it is found that the grid 31B out of the three grids 31A, 31B and 31C marked by the end point marks 51 can be reached with a minimum cost of "6" via a wiring route 40a. Accordingly, the wiring route 40a is defined as the re-routing result of Net 1 and the movable terminal 10A is moved from the grid 31A as the initial position to the grid 31B.

Next, the process returns to Step S3. If it is determined that the process should not end, Steps S3 through S6 are repeatedly performed.

In this embodiment, the present invention has been described as being applied to single-layer wiring. Alternatively, the present invention is naturally applicable to multilayer wiring consisting of two or more layers if the costs of contacts are taken into consideration as in the conventional method.

Embodiment 2

Figure 6:
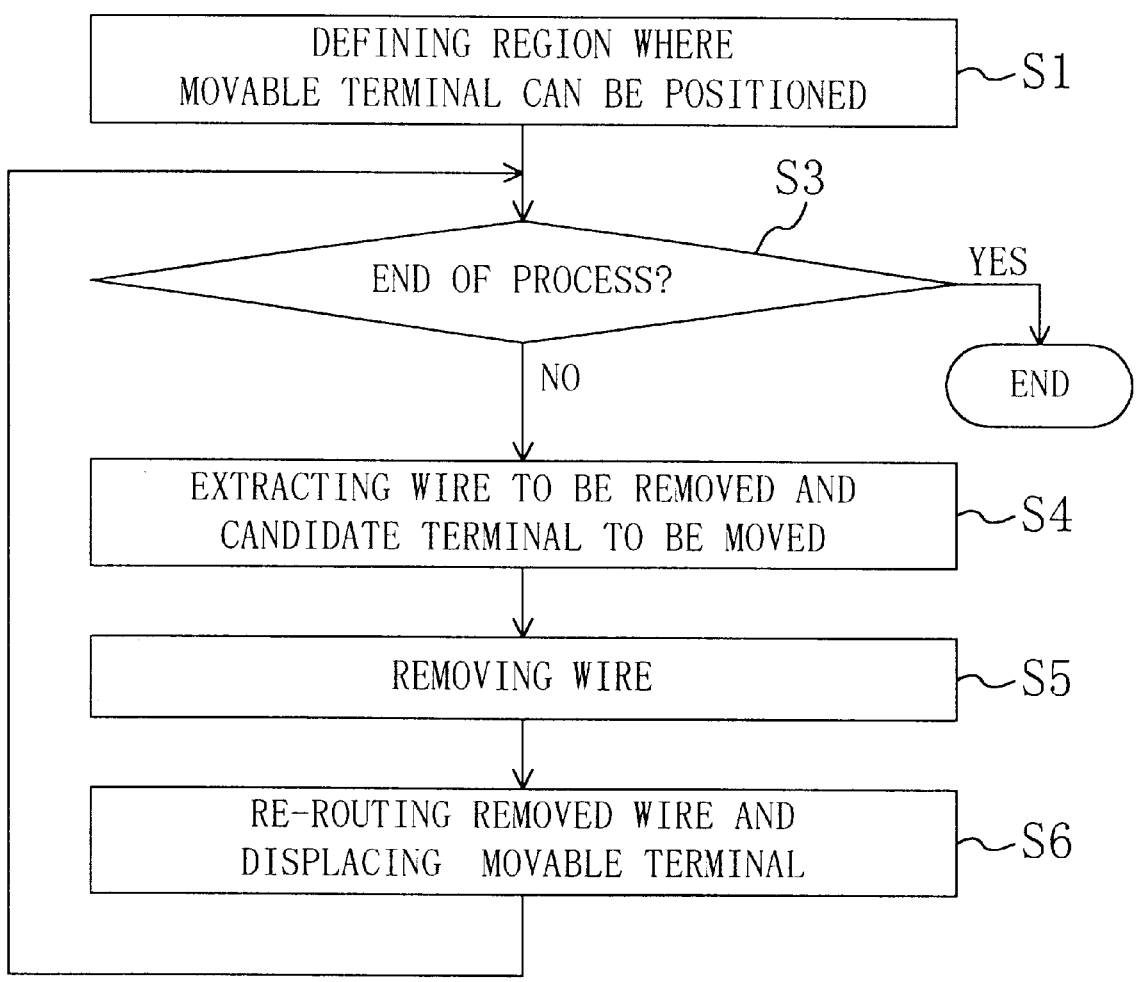
FIG. 6 is a flow chart illustrating the processing procedure of an automatic routing method in the second embodiment of the present invention.

FIG. 6 is a flow chart illustrating the processing procedure of an automatic routing method in the second embodiment of the present invention. An automatic routing program, illustrated by this flow chart, is stored in a computer readable storage medium and used for routing and designing an LSI by a computer.

In FIG. 6, in Step S1, a region where a movable terminal can be positioned is defined. In this embodiment, the number of wiring layers is assumed to be one for the sake of simplicity. This embodiment is characterized in that no design rule error such as overlap and intersection of wires is allowed during the routing process. The routing process of this embodiment will be described in detail with reference to FIG. 7.

Figure 7:
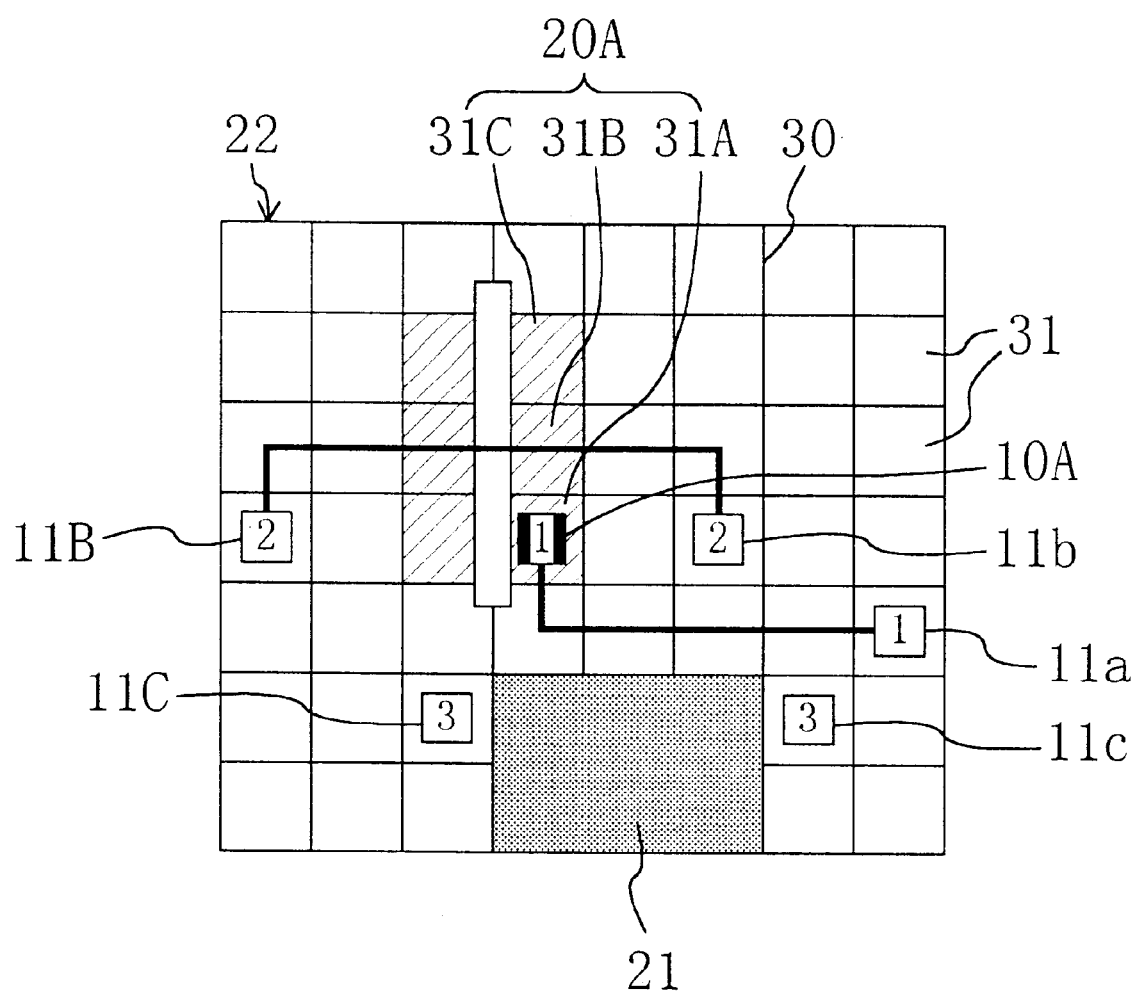
FIG. 7 is a diagram illustrating an intermediate stage of routing in accordance with the automatic routing method of the second embodiment.

As shown in FIG. 7, a wiring region 22 is divided into a large number of grids 31 with a plurality of grid lines 30. Terminals include a movable terminal 10A and fixed terminals 11a, 11B, 11b, 11C and 11c. The numerals in the respective terminals denote the numbers of nets. Net 1 includes the movable terminal 10A and the fixed terminal 11a. The movable terminal 10A has a size corresponding to one grid. Herein, it is assumed that the movable terminal 10A is freely placeable within the movable terminal placeable region 20A in which three grids 31A, 31B and 31C are located. In routing and designing at a transistor level, the movable terminal corresponds to a source/drain terminal, while the movable terminal placeable region 20A corresponds to a source/drain region. The fixed terminal is, for example, a gate terminal. Net 2 includes the fixed terminals 11B and 11b, and Net 3 includes the fixed terminals 11C and 11c. In FIG. 7, a wiring forbidden region 21 exists.

In FIG. 6, in Step S3, it is determined that the routing process should end if no design rule error exists in the current wires and if no non-routable net exists. In FIG. 7, routing of Net 3 cannot be completed because the wire of Net 1 obstructs. Thus, the process should not end and proceeds to the next Step S4.

In FIG. 6, in the next Step S4, obstructive wires and movable terminals, causing non-routable wires, are extracted. In FIG. 7, since Net 1 is obstructive for Net 3, Net 1 is extracted as the wire to be removed. Furthermore, if there is any movable terminal in the net extracted as the wire to be removed, then the movable terminal is extracted as a candidate terminal to be moved. In this example, since Net 1 as the wire to be removed has the movable terminal 10A, the terminal 10A is extracted as a candidate terminal to be moved.

The next Step S5 of removing a wire is performed in the same way as the conventional method. Specifically, Net 1 is removed.

Next, in Step S6, the removed wire is re-routed and the candidate terminal to be moved is displaced, and the process returns to Step S3. In FIG. 7, Net 1 is removed, Net 3 is routed and then the removed Net 1 is re-routed.

The movable terminal 10A belonging to Net 1 has the initial position thereof defined at the grid 31A in the first embodiment. However, the movable terminal 10A has also been extracted as a candidate terminal to be moved in Step S4. Thus, the current position of the movable terminal 10A is invalidated, an optimum position is re-selected for the terminal 10A from the movable terminal placeable region 20A and then Net 1 is re-routed based on the optimum position to which the movable terminal has been moved. This re-routing step is performed in the following manner.

Figure 8:
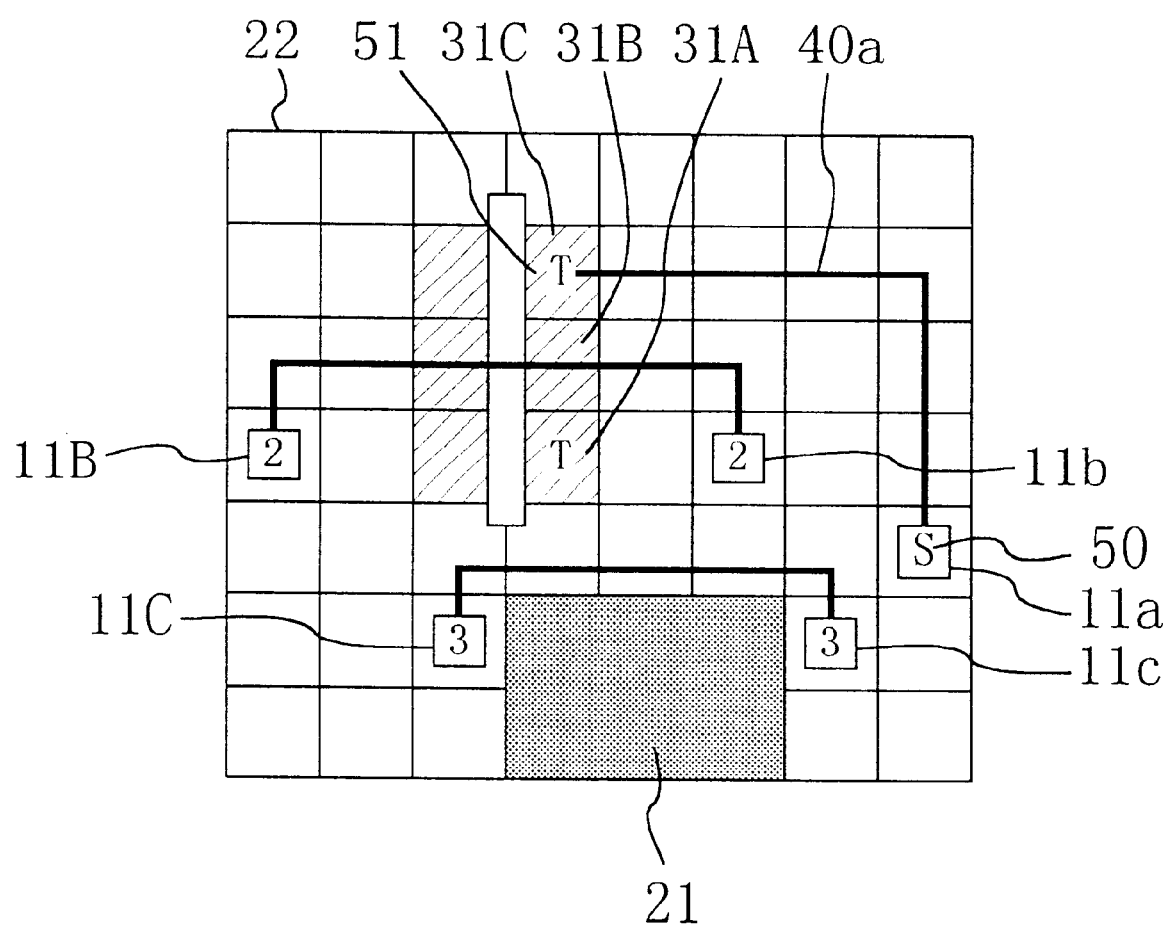
FIG. 8 is a diagram illustrating the results of re-routing and displacing a terminal in accordance with the automatic routing method of the second embodiment.

First, the fixed terminal 11a is marked by a start point mark 50 (S) as shown in FIG. 8. Next, two grids 31A and 31C out of the three grids 31A, 31B and 31C located in the movable terminal placeable region 20A for the movable terminal 10A are marked by end point marks 51 (T). This is because the grid 31B is used by the wire of Net 2.

Then, in accordance with the maze search method described in the Background section, a route having a minimum cost is searched for. A wiring route cost used for re-routing is given by the following Equation 6:

$$\text{Wiring route cost} = a \times (\text{wire length}) \tag{6}$$

(where a is a parameter)

As a result of this maze search, it is found that the grid 31C out of the two grids 31A and 31C marked by the end point marks 51 can be reached with a minimum cost via a route 40a. Accordingly, the route 40a is defined as the re-routing result of Net 1 and the movable terminal 10A is moved from the grid 31A as the initial position to the grid 31C.

Next, the process returns to Step S3. And Steps S3 through S6 are repeatedly performed until the process ends. In FIG. 7, since no non-routable net exists, the process ends.

Figure 9A:
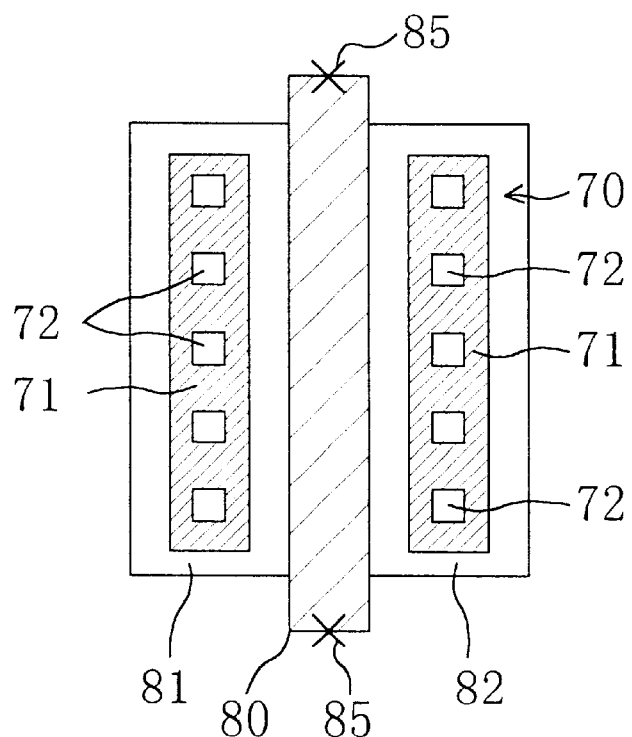
FIG. 9(a) is a schematic representation of a conventional MOSFET.
Figure 9B:
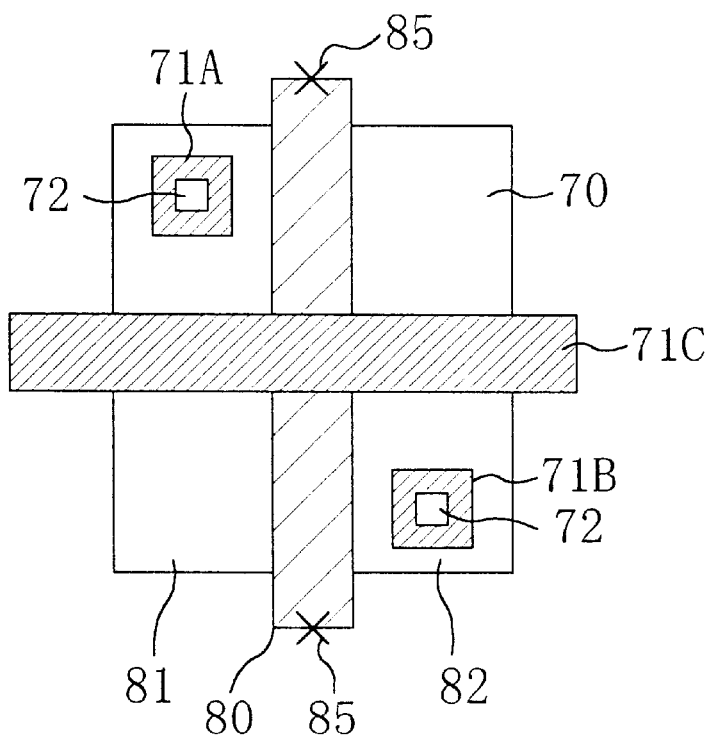
FIG. 9(b) illustrates a specific example of a movable terminal.

In this embodiment, the gate terminal is regarded as a fixed terminal. This is because it is difficult to form a contact over a gate in accordance with the current fabrication technologies and because it is only possible to extend the gate electrode from the position of the gate terminal 85 shown in FIGS. 9(a) and 9(b). Thus, should the progress in fabrication technologies such as that disclosed in Japanese Patent Application No. 7-048063 make it possible to extend a gate electrode from any arbitrary position in the gate region 80 in the future, then the gate terminal will be able to be treated as a movable terminal.

In the first and second embodiments, automatic routing in accordance with a maze search method has been described. However, the present invention is not limited thereto, but encompasses automatic routing in accordance with other route search methods.

Embodiment 3

FIG. 10 is a flow chart illustrating the processing procedure of a wiring route search method in the third embodiment of the present invention. A wiring route search program, illustrated by this flow chart, is stored in a computer readable storage medium and used for routing and designing an LSI or the like by a computer.

First, in Step S101, a height constraint on a wiring region and hardwiring information are input. The height constraint and hardwiring information will be described in detail with reference to FIGS. 11(a) and 11(b).

As shown in FIG. 11(a), a wiring region 20 is divided into a large number of grids 30. In the wiring region 20, terminals 10A, 10a, 10B, 10b, 10C and 10c and a wiring forbidden region 21 exist. A height constraint 101 of "4" (i.e., the number of vertical grids is four) is given to the wiring region. Herein, two wiring layers, i.e., first and second wiring layers, are assumed to exist.

FIG. 11(a) illustrates the wiring region in the first wiring layer. The numerals in the terminals 10A, 10a, 10B, 10b, 10C and 10c denote the numbers of nets and three pairs of terminals, each having the same net number, should be hard-wired. In FIG. 11(a), a case where Nets 2 and 3 have already been routed and Net 1 is yet to be routed will be described. The start point of Net 1 is the terminal 10A and the end point thereof is the terminal 10a.

Step S102 of extracting searchable grids is performed in the same way as Step S20 of the conventional method.

Hereinafter, Step S103 of calculating the number of available grids for a column of grids (corresponding to the step of calculating the number of available grids) shown in FIG. 10 will be described with reference to FIGS. 11(a) and 11(b).

The number of available grids is defined for a column of grids by the following Equation 7:

Number of available grids for column of grids=(height constraint on wiring region)−(height of wiring forbidden region)−(height of regions occupied by wires) (7)

In FIG. 11(a), the numbers of available grids are calculated for columns of grids No. 5, 6 and 10 in the wiring region 20 in the first wiring layer with respect to Net 1.

In the column of grids No. 5, the terminal 10C of Net 3 exists. Herein, the size of the terminal is assumed to be "1". Since the terminal 10C of Net 3 is a wiring forbidden region for Net 1, the number of available grids for this column of grids is "3" (=4−1−0).

In the column of grids No. 6, a wiring forbidden region having a height of "2", the terminal 10B of Net 2 and a horizontal wire of Net 3 exist. The size of the terminal and the height of a region occupied by a single wire are each assumed to be "1". Since the terminal 10B of Net 2 is a wiring forbidden region for Net 1, the number of available grids for this column of grids is "0" (=4−3−1).

In the column of grids No. 10, the terminal 10a of Net 1, the terminal 10b of Net 2 and a vertical wire of Net 2 exist. The terminal 10a of Net 1 is not a wiring forbidden region for Net 1. The terminal 10b of Net 2 is a wiring forbidden region for Net 1 and the size of the terminal is assumed to be "1". Since the length of the vertical wire of Net 2 is "2", the number of available grids of the column No. 10 is "1" (=4−1−2).

The numbers of available grids that are calculated in a similar manner for the remaining columns of grids Nos. 1 to 4, 7 to 9, and 11 are shown in FIG. 11(b). As for the second wiring layer, the numbers of available grids for columns of grids can be calculated in the same manner. Since no terminals and no wiring forbidden regions exist in the second wiring layer, the number of available grids is "4" in all the columns of grids.

In FIG. 10, in Step S104, when route search advances to one of the searchable grids extracted in Step S102, a grid column passage cost is added to the column of grids, to which the searchable grid belongs, based on the number of available grids calculated for the column of grids in Step S103.

A grid column passage cost when a column of grids having the number of available grids of "S" is passed is defined by the following Equation 8:

Grid column passage cost=100 (if $S \leq 0$)

Grid column passage cost=0 (if $S > 0$)  (8)

It is noted that the grid column passage cost when $S \leq 0$ may be such a high value as enabling the selection of other wiring routes and is not limited to "100".

Step S105 of determining whether or not an end point has been reached and Step S106 of selecting a route having a minimum cost are the same as Steps S50 and S60 of the conventional method, respectively.

Then, Steps S102 through S105 are repeatedly performed until the end-point grid 10a is reached.

Figure 12A:
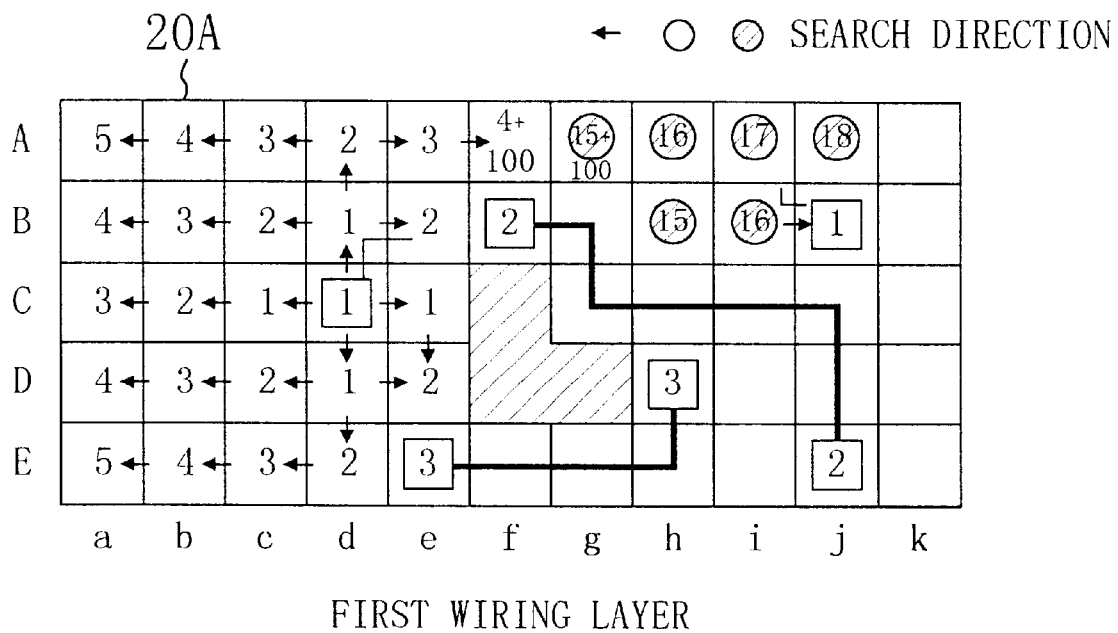
FIGS. 12(a) and 12(b) are diagrams illustrating the respective results of the wiring route search performed for a predetermined net on the first and second wiring layers in accordance with the wiring route search method of the third embodiment.
Figure 12B:
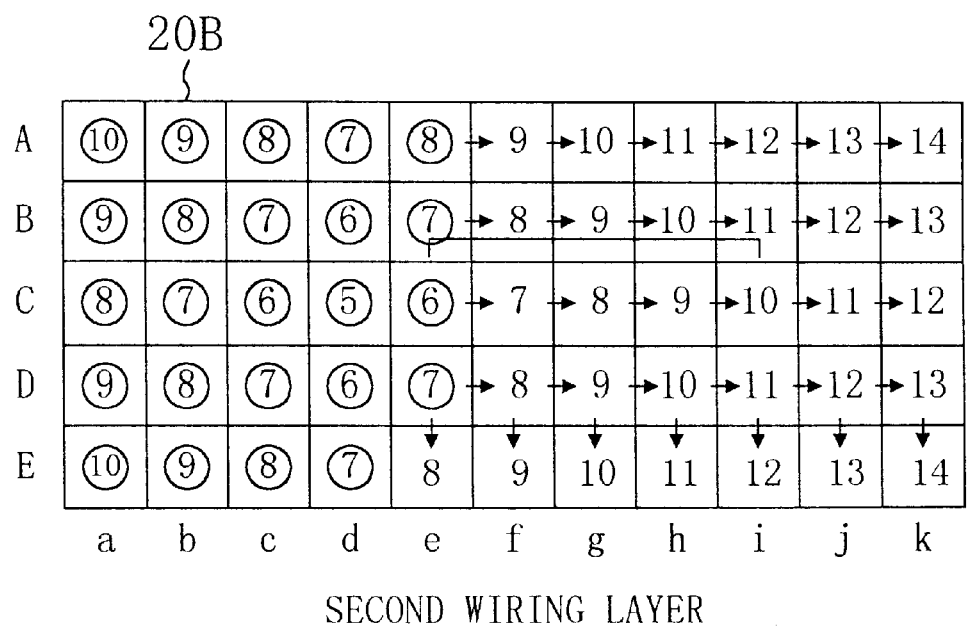

FIGS. 12(a) and 12(b) illustrate the results of wiring route search for Net 1. In the respective grids, each value in the first term represents the sum of a wire length cost and a contact cost, and each value in the second term represents a grid column passage cost. For example, as for the indications "4+100" and "15+100" in FIG. 12(a), "4" and "15" represent the sums of costs in the first terms and "100" represents the grid column passage costs. As for the grids having the second term of "0", only the first terms are indicated. In FIGS. 12(a) and 12(b), the signs a through k and A through E denote abscissas and ordinates, respectively.

The wire length cost is determined in the same way as described in the Background section. The contact cost has also been frequently used conventionally and is described in the document cited in the Background section. In this embodiment, every time one contact is produced, a cost "5" is added.

Figure 13A:
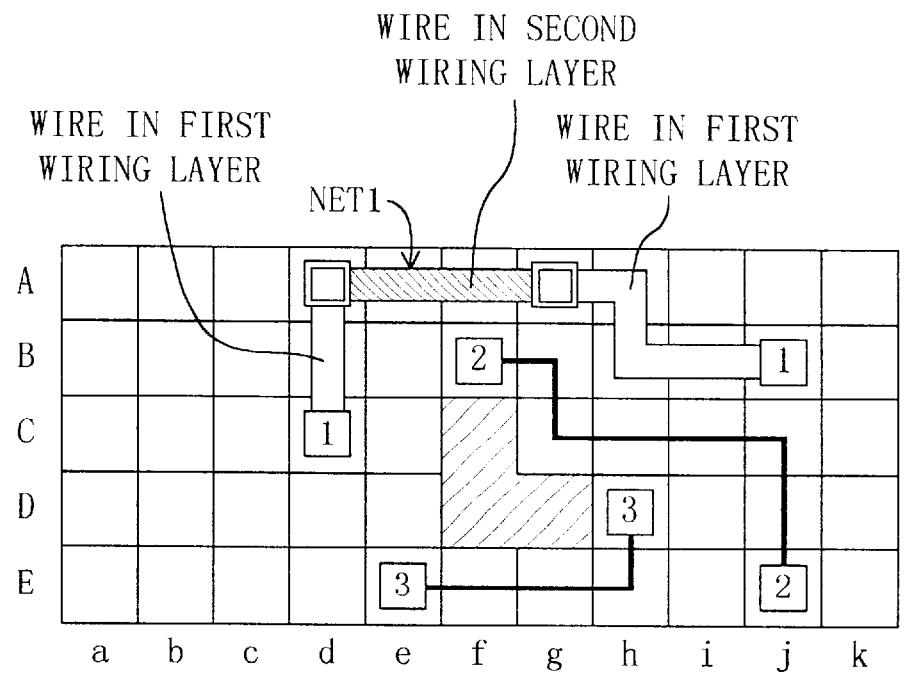
FIG. 13(a) is a diagram illustrating a specific example in which the wiring route of Net 1 is specified in a manner based on the results of the wiring route search shown in FIGS. 12(a) and 12(b)
Figure 13B:
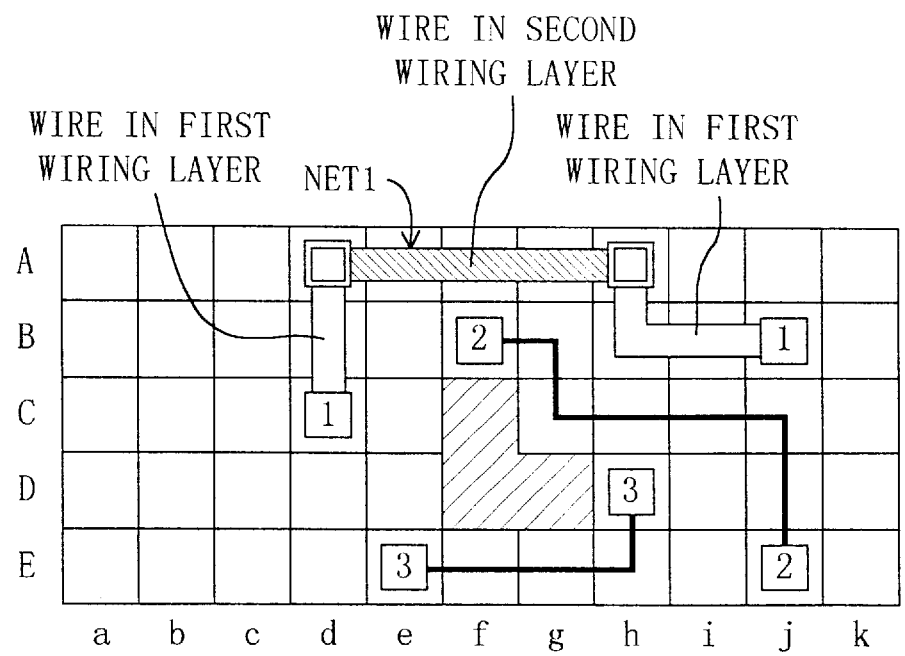
FIG. 13(b) is a diagram illustrating another specific example in which the wiring route of Net 1 is specified in another manner based on the results of the wiring route search shown in FIGS. 12(a) and 12(b).

The search results shown in FIGS. 12(a) and 12(b) will be described in detail below. For example, if Net 1 is routed as shown in FIG. 13(a), then the routing cost is "117". On the other hand, if Net 1 is routed as shown in FIG. 13(b), then the routing cost is "17". This difference in costs results from the following fact. Since the grid column passage cost of "100" is given to the grid belonging to the column of grids No. 7 in the first wiring layer and having coordinates (g, A) (see FIG. 11), a contact is disposed in the grid having the coordinates (g, A) in the wiring route shown in FIG. 13(a), but is not disposed in the grid in the wiring route shown in FIG. 13(b).

Next, when the end-point terminal 10a is reached, the search routes shown in FIGS. 12(a) and 12(b) are traced back from the end-point terminal 10a in Step S106, thereby extracting a wiring route 40 having a minimum cost. The search directions are indicated by arrows, open circles and hatched circles. The non-hatched, open circles indicate the search directions from the first wiring layer 71 to the second wiring layer 72. The hatched circles indicate the opposite search directions.

Figure 14A:
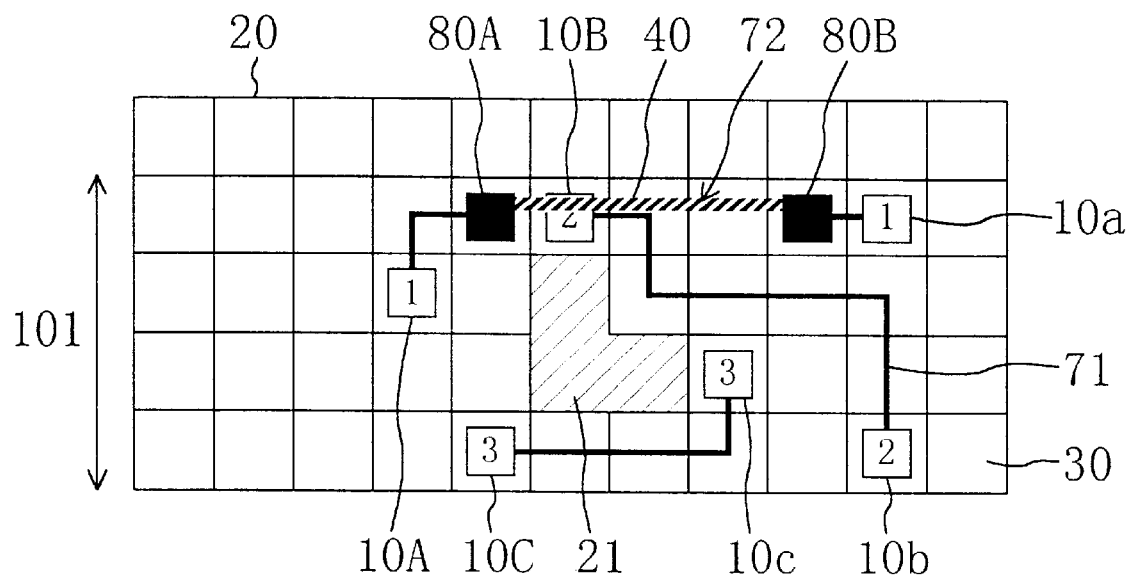
FIG. 14(a) is a diagram illustrating the results of routing in accordance with the wiring route search method of the third embodiment.

The results of routing are shown in FIG. 14(a). The wiring route 40 having a minimum wiring route cost for Net 1 changes from the first wiring layer 71 to the second wiring layer 72 at a contact 80A and then changes from the second wiring layer 72 to the first wiring layer 71 at a contact 80B.

Figure 14B:
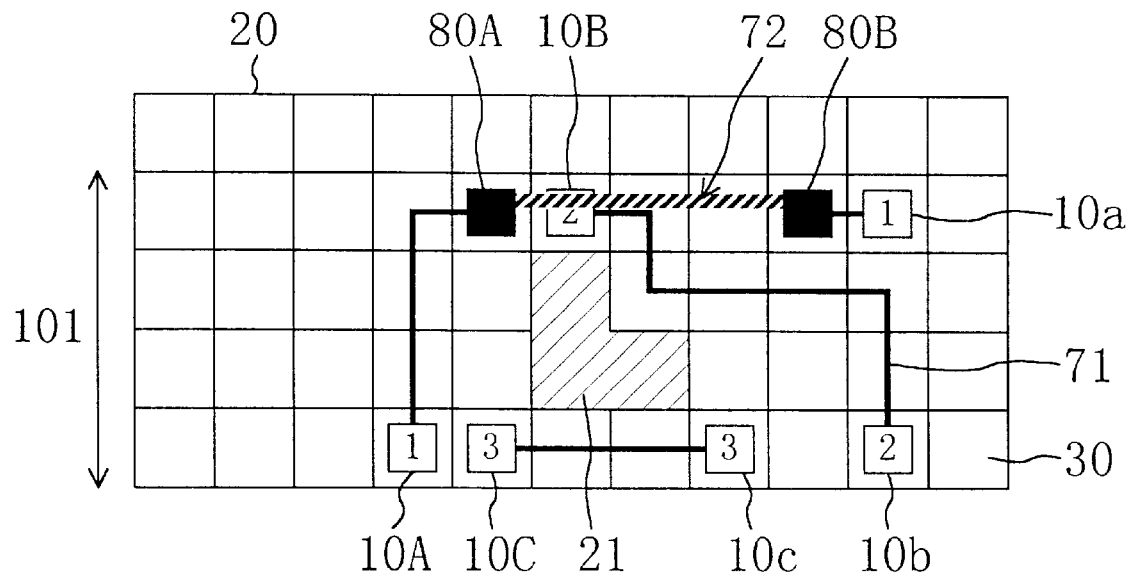
FIG. 14(b) is a diagram illustrating the results obtained by compacting the results shown in FIG. 14(a).

The results obtained by compacting the results shown in FIG. 14(a) are shown in FIG. 14(b). It can be understood that the height constraint 101 is satisfied.

Embodiment 4

Figure 15:
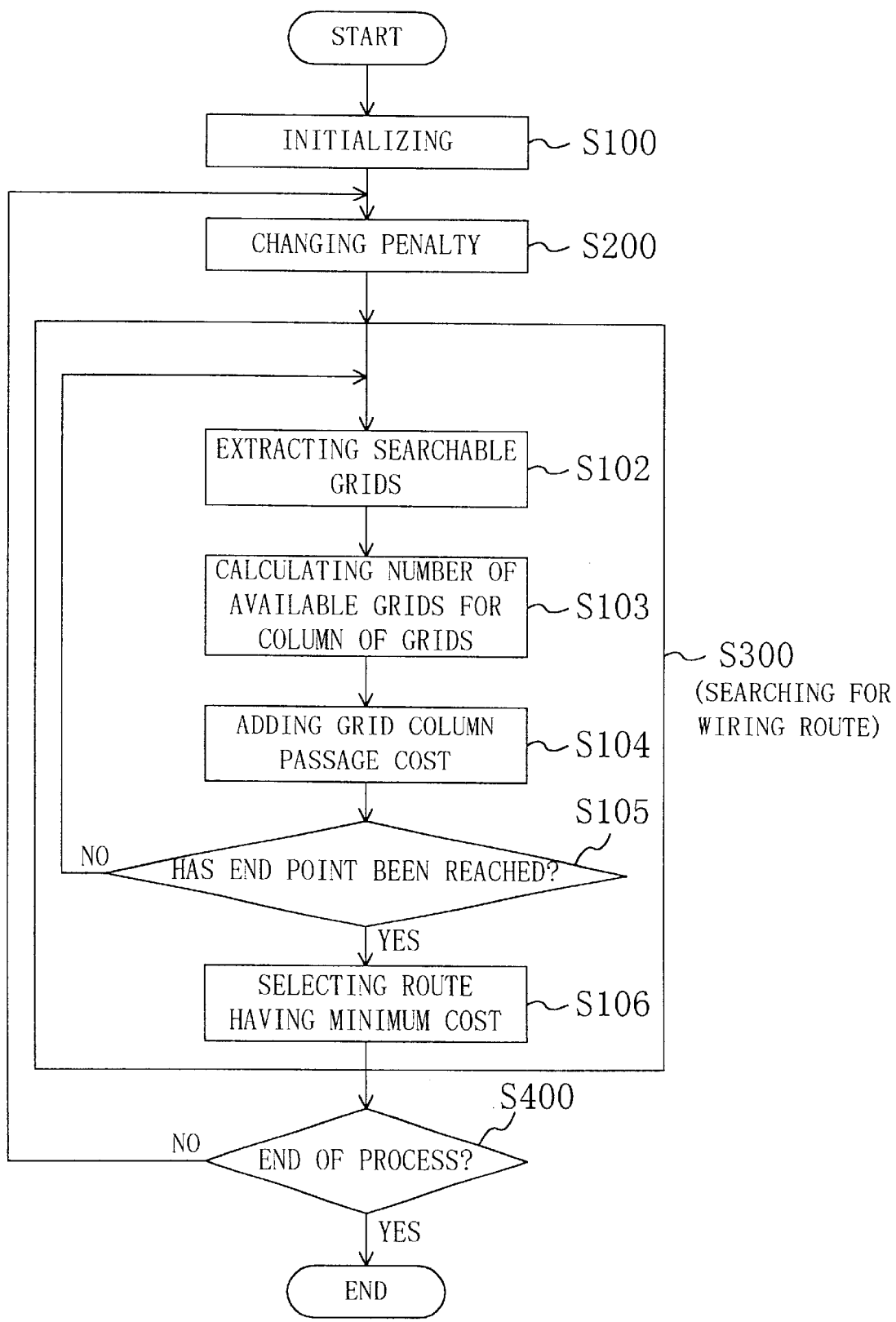
FIG. 15 is a flow chart illustrating the processing procedure of a wiring routing search method in the fourth embodiment of the present invention.

FIG. 15 is a flow chart illustrating the processing procedure of a wiring route search method in the fourth embodiment of the present invention. A wiring route search program, illustrated by this flow chart, is stored in a computer readable storage medium and used for routing and designing an LSI or the like by a computer.

In FIG. 15, in Step S100, a penalty p for failing to satisfy a height constraint (i.e., a cost when a crowded region is passed), which is subsequently used in Step S300 of searching for a wiring route, is initialized. And a predetermined number of height constraint errors, which is subsequently used for Step S400 of determining whether or not the process should end, is also initialized at "0".

In Step S200, the penalty p is changed. The penalty p is increased as Step S200 through S400 are repeatedly performed a larger number of times. That is to say, at the initial stage of repetition, the penalty p is set at a small value. And as the number of times of repetition increases, the penalty p is increased.

Next, in Step S300, a wiring route search is performed on all the nets. The processing flow of Step S300 is the same as that illustrated in FIG. 10.

In Step S4 of adding a grid column passage cost, the grid column passage cost for a case of passing a column of grids having a number of available grids S is defined by the following Equation 9 using the penalty p:

Grid column passage cost=$p$(if $S \leq 0$)

Grid column passage cost=0(if $S > 0$)  (9)

In Step S400, it is determined whether or not the number of height constraint errors has become equal to or smaller than a predetermined value in every column of grids in each layer. If the numbers are all equal to or smaller than the predetermined value, then the routing process ends. On the other hand, if any number exceeds the predetermined value, then the process returns to Step S200. Since the predetermined number of the height constraint errors is set at "0" in Step S100, Steps S200 through S400 are repeatedly performed until there is no height constraint error.

In the following description, the wiring route cost is calculated using the wire length, the number of contacts and the grid column passage cost as represented by the following Equation 10:

Wiring route cost=$a$×(wire length)+$b$×(number of contacts)+$p$× (number of times grid columns with no available grids have been passed) (10)

(where a and b are parameters)

Next, before a specific example of this embodiment is described, it will be discussed with reference to FIGS. 16 through 18 what types of problems happen if the penalty p is fixed at a large value.

Figure 16:
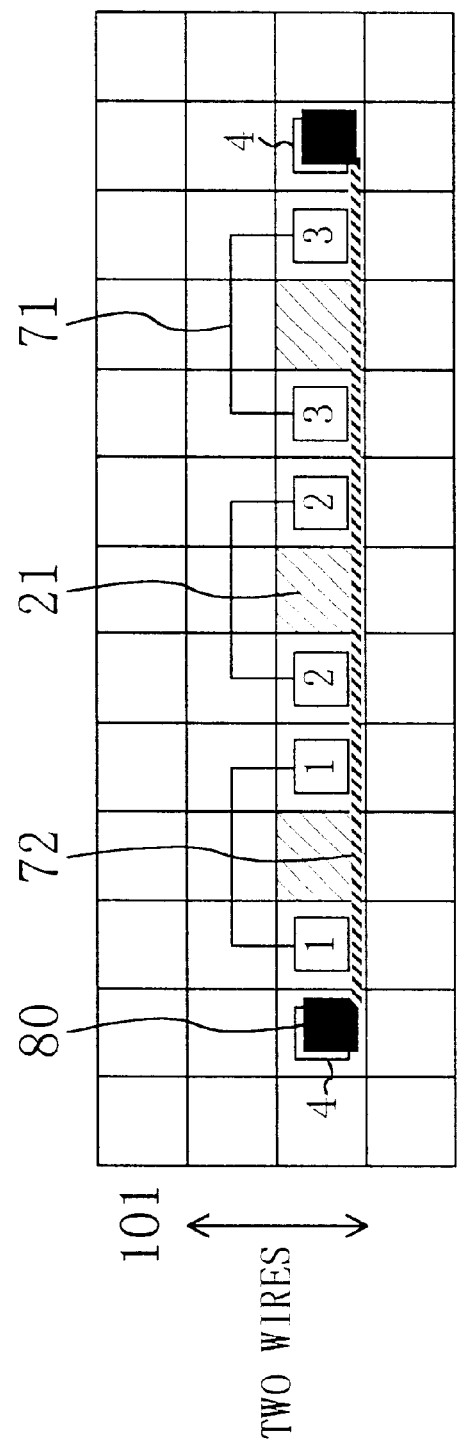
FIG. 16 is a diagram with a table for illustrating a problem happening when a penalty for failing to satisfy a height constraint is fixed and the results obtained by routing in the order of Nets 1, 2, 3 and 4.
Figure 17:
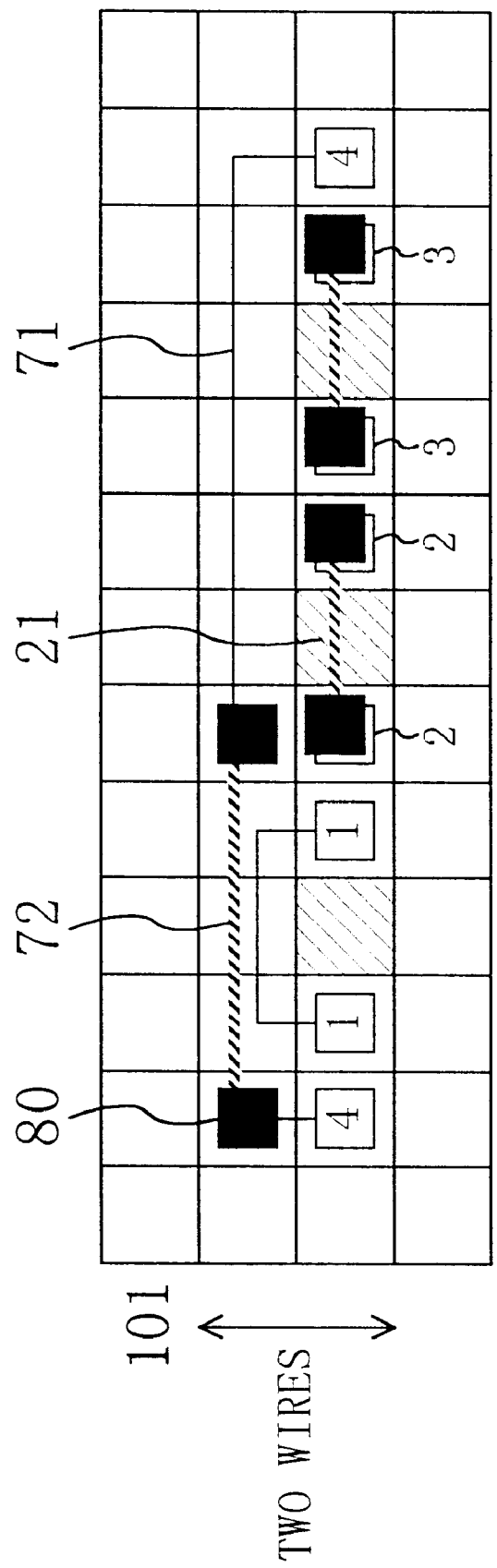
FIG. 17 is a diagram for illustrating the problem and the results obtained by routing in the order of Nets 1, 4, 2 and 3.
Figure 18:
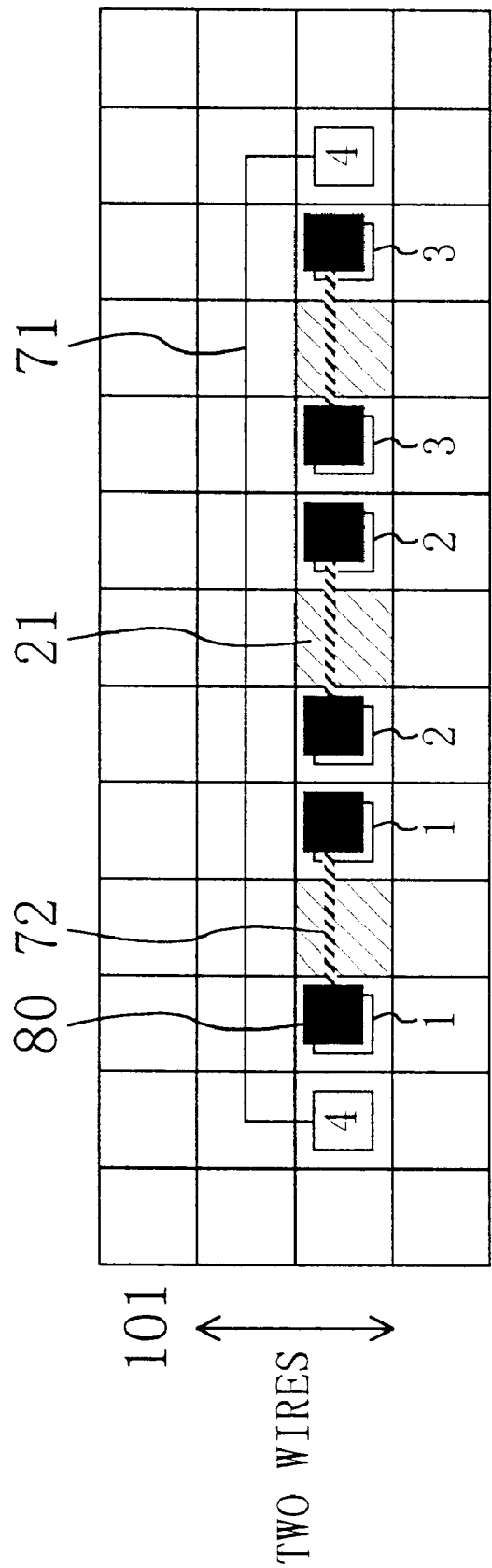
FIG. 18 is a diagram for illustrating the problem and the results obtained by routing in the order of Nets 4, 1, 2 and 3.

FIGS. 16 through 18 illustrate the problems happening when Nets 1 to 4 are routed using first and second wiring layers and applying a height constraint 101 corresponding to two wires (or two grids) to each layer. It is herein assumed that terminals and a wiring forbidden region 21 are present in the first layer.

In Equation 10, the parameter a is set at 1 and 2 for the first and second wiring layers, respectively. The parameter b is set at 5. And the penalty p is fixed at 100, which is sufficiently larger than the parameters a and b.

The results of routing in the order of Nets 1, 2, 3 and 4 are illustrated in FIG. 16. The wiring route costs of the respective nets are as follows.

Nets 1, 2 and 3: 1×4(wire length in first layer)=4

Net 4: 2×10(wire length in second layer)+5×2(number of contacts)=30

Thus, the sum of the wiring route costs of all the nets is 42.

The results of routing in the order of Nets 1, 4, 2 and 3 are illustrated in FIG. 17. The wiring route costs of the respective nets are as follows.

Net 1: 1×4(wire length in first layer)=4

Nets 2 and 3: 2×2(wire length in second layer)+5×2(number of contacts)=14

Net 4: 1×8(wire length in first layer)+2×4(wire length in second layer)+5×2(number of contacts)=26

Thus, the sum of the wiring route costs of all the nets is 58.

The results of routing in the order of Nets 4, 1, 2 and 3 are illustrated in FIG. 18. The wiring route costs of the respective nets are as follows.

Nets 1, 2 and 3: 2×2(wire length in second layer)+5×2(number of contacts)=14

Net 4: 1×12(wire length in first layer)=12

Thus, the sum of the wiring route costs of all the nets is 54.

All the results shown in FIGS. 16 through 18 satisfy the height constraint. Of these results, those shown in FIG. 16 in which the sum of the wiring route costs of all the nets is the minimum are better than the results shown in FIGS. 17 and 18. As can be understood, if the penalty p is fixed at a large value, the results of routing greatly depend on the order of routing, and the cost does not always become minimum in all types of routing.

Next, a specific example of this embodiment will be described with reference to FIGS. 19 through 21.

First, in Step S100, the initial value of the penalty p, which is to be used in Step S104 as one of the processing steps of Step S300, is set at "0". And the predetermined number of height constraint errors used in Step S400 is also set at "0".

The order of routing is defined as Nets 4, 1, 2 and 3. In Equation 10, the parameter a is set at 1 and 2 for the first and second wiring layers, respectively, while the parameter b is set at 5. In the following description, a repetitive number is defined as a number representing how many times Steps S200 through S400 shown in FIG. 15 are passed (or repeated).

Figure 19:
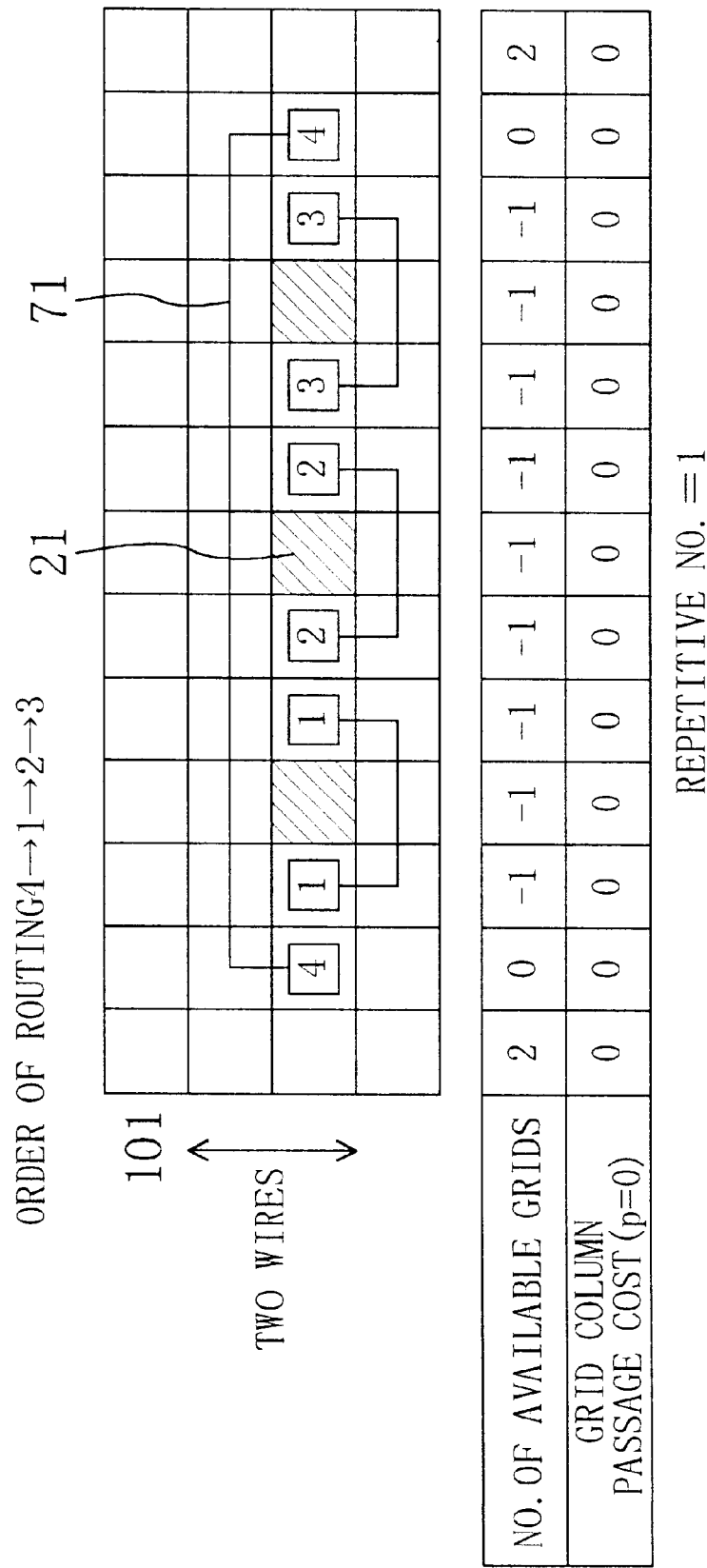
FIG. 19 is a diagram with a table for illustrating an intermediate processing stage in which the repetitive number of processes is set at 1 in accordance with the wiring route search method of the fourth embodiment.

FIG. 19 illustrates a case where the repetitive number is 1. The penalty p remains the same as the initial value of 0. In such a case, Equation 10 is modified as:

Wiring route cost=1×(wire length)+5×(number of contacts) (10a)

Then, the wiring routes, in which the wiring route costs for the respective nets are given by:

Nets 1, 2 and 3: 1×4(wire length in first layer)=4

Net 4: 1×12(wire length in first layer)=12 can be obtained. Since the penalty p is set at 0 in this case, the results of routing do not satisfy the height constraint. In FIG. 19, a number of available grids having a negative value (−1) means that the height constraint is not satisfied.

Figure 20:
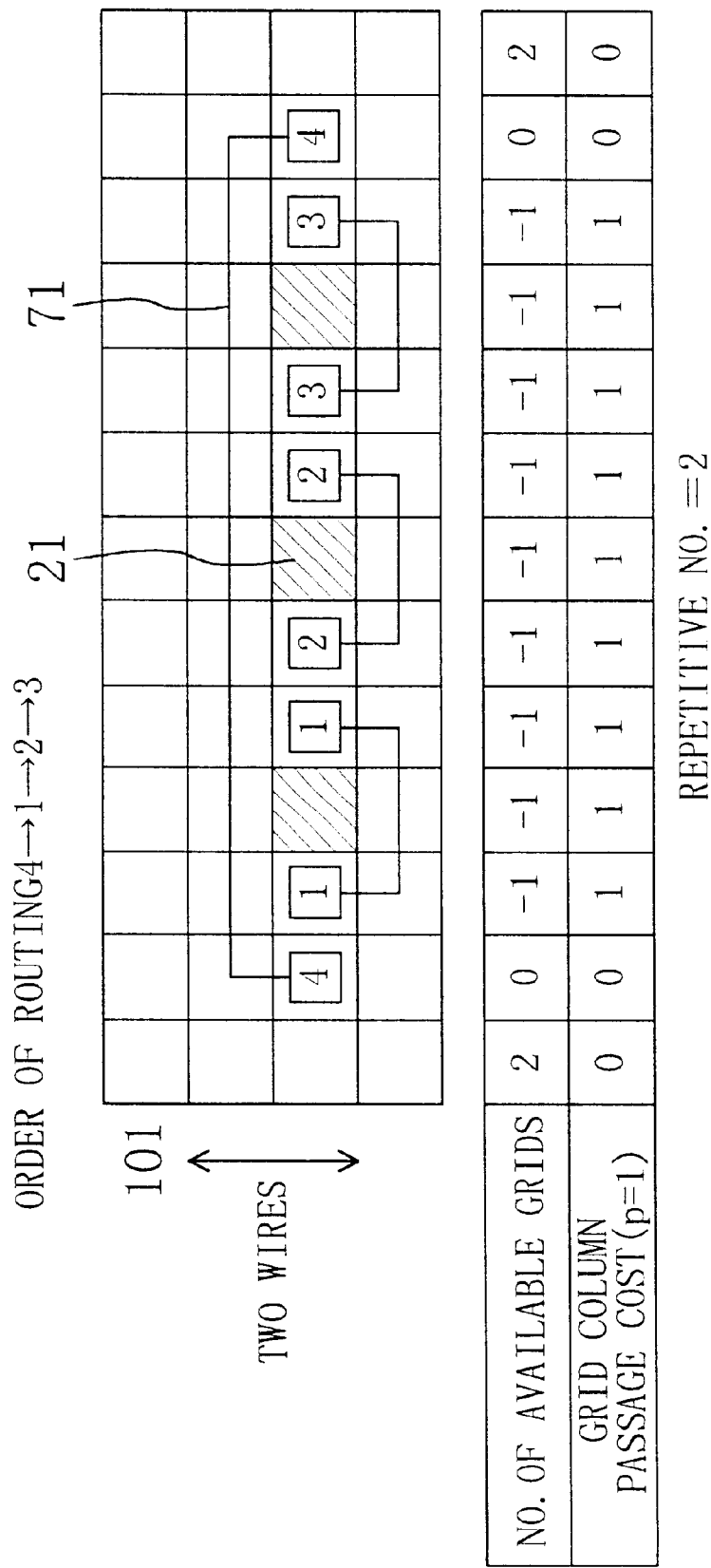
FIG. 20 is a diagram with a table for illustrating an intermediate processing stage in which the repetitive number of processes is set at 2 in accordance with the wiring route search method of the fourth embodiment.

FIG. 20 illustrates a case where the repetitive number is 2. In Step S200, the penalty p is changed into 1. In such a case, Equation 10 is modified as:

Wiring route cost=1×(wire length)+5×(number of contacts)+1× (number of times grid columns with no available grids have been passed) (10b)

The number of times grid columns with no available grids have been passed for Nets 4, 1, 2 and 3 are "9", "3", "3" and "3", respectively. Since the costs regarding the formation of contacts are higher than the grid column passage costs, the routes are not changed and the same results as those illustrated in FIG. 19 are obtained. The wiring route costs of the respective nets are as follows:

Nets 1, 2 and 3: 1×4(wire length in first layer)+1×3 (number of times grid columns with no available grids have been passed)=7

Net 4: 1×12(wire length in first layer)+1×9(number of times grid columns with no available grids have been passed)=21

Figure 21:
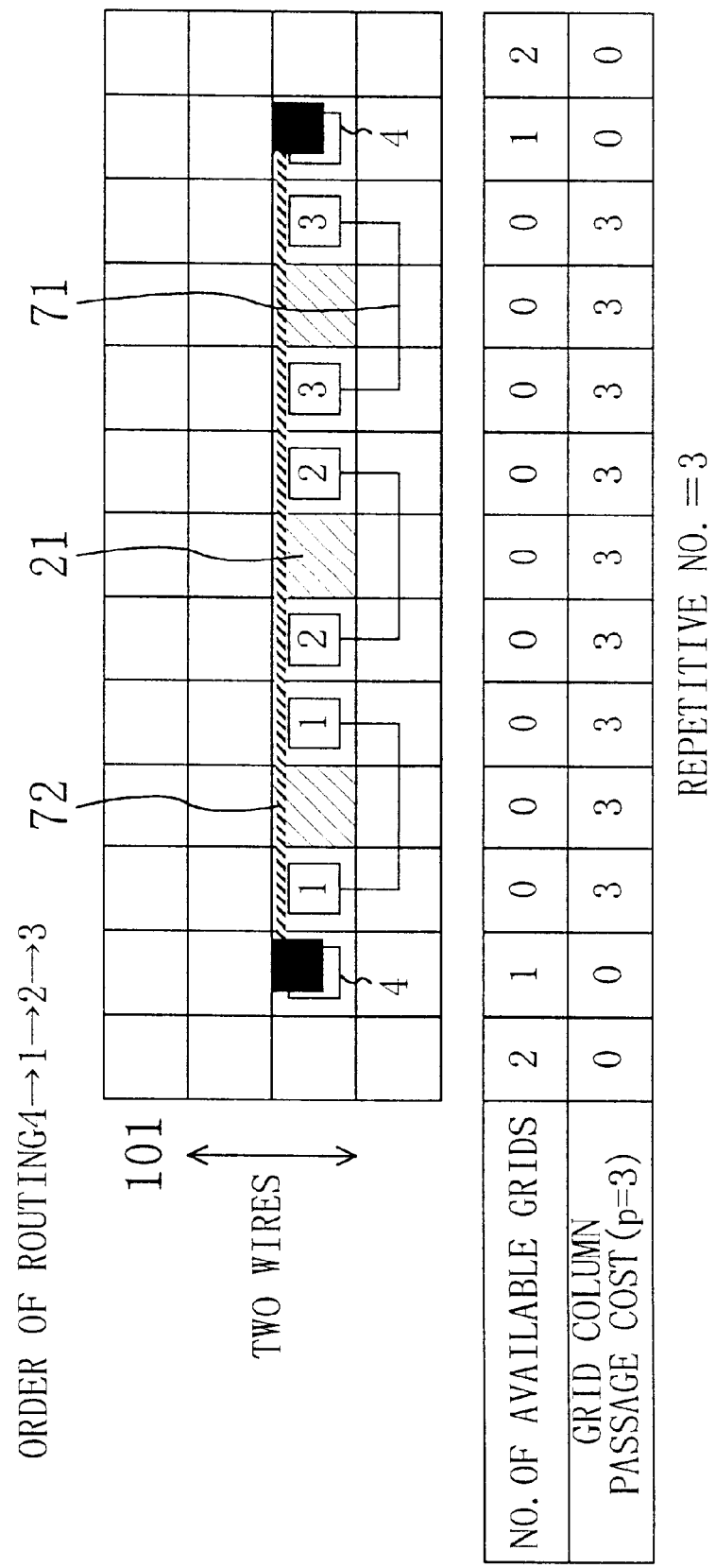
FIG. 21 is a diagram with a table for illustrating an intermediate processing stage in which the repetitive number of processes is set at 3 in accordance with the wiring route search method of the fourth embodiment.

FIG. 21 illustrates a case where the repetitive number is 3. In Step S200, the penalty p is changed into 3. As for Net 4, the wiring route cost of the same route as that shown in FIG. 19 is:

Net 4: 1×12(wire length in first layer)+3×9(number of times grid columns with no available grids have been passed)=39

As shown in FIG. 21, since the cost of a wiring route, which uses two contacts and the second wiring layer and is given by:

Net 4: 2×10(wire length in first layer)+5×2(number of times grid columns with no available grids have been passed)=30 is smaller, the route is changed into that illustrated in FIG. 21. As for Nets 1, 2 and 3, the wiring route cost is:

Nets 1, 2 and 3: 1×4(wire length in first layer)=4 that is, the same minimum cost as that of the route illustrated in FIG. 19. Thus, the route is not changed.

When the number of height constraint errors becomes "0" by repeatedly performing these processing steps, the process ends.

Figure 22:
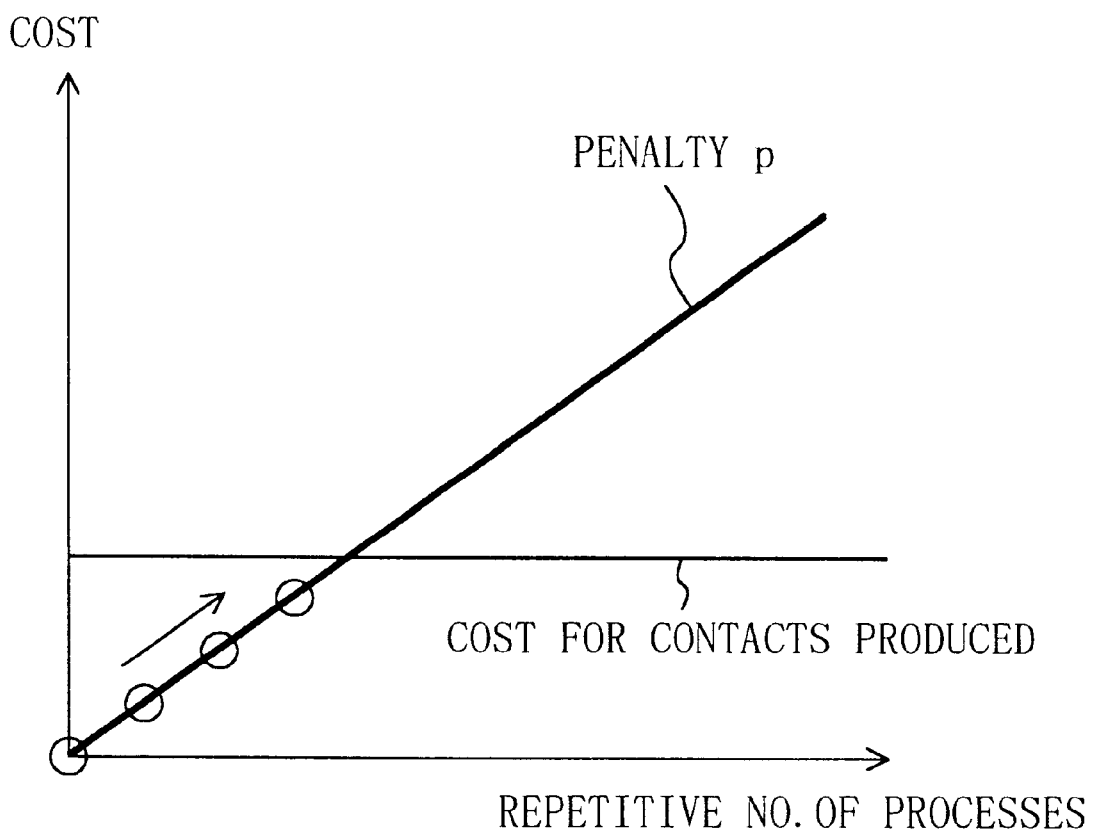
FIG. 22 is a graph illustrating how the penalty p changes.

As can be understood, by repeatedly performing re-routing without changing the order of routing for nets and with the penalty p gradually increased (see FIG. 22), wiring routes resulting in the minimum sum of wiring route costs can be found in consideration of both the cost when a crowded region is passed and the cost when a contact is produced. As a result, all the wires can be routed with a small penalty p. The smaller the penalty p is, the more satisfactory routing results can be attained with the smaller degree of dependence on the order of routing for the nets. In this embodiment, results of routing, in which the number of overall contacts is the smallest and the height constraint is also satisfied, can be obtained without any dependence on the order of routing.

The penalty p for failing to satisfy the height constraint may be changed in any other arbitrary way than that exemplified in this embodiment. For example, as represented by the following Equation 11, the penalty p may be changed in proportion to a repetitive number i Steps S200 through S400 are repeatedly performed.

$$\text{Penalty } p=(1-\exp(i))\times 100 \tag{11}$$

Figure 23:
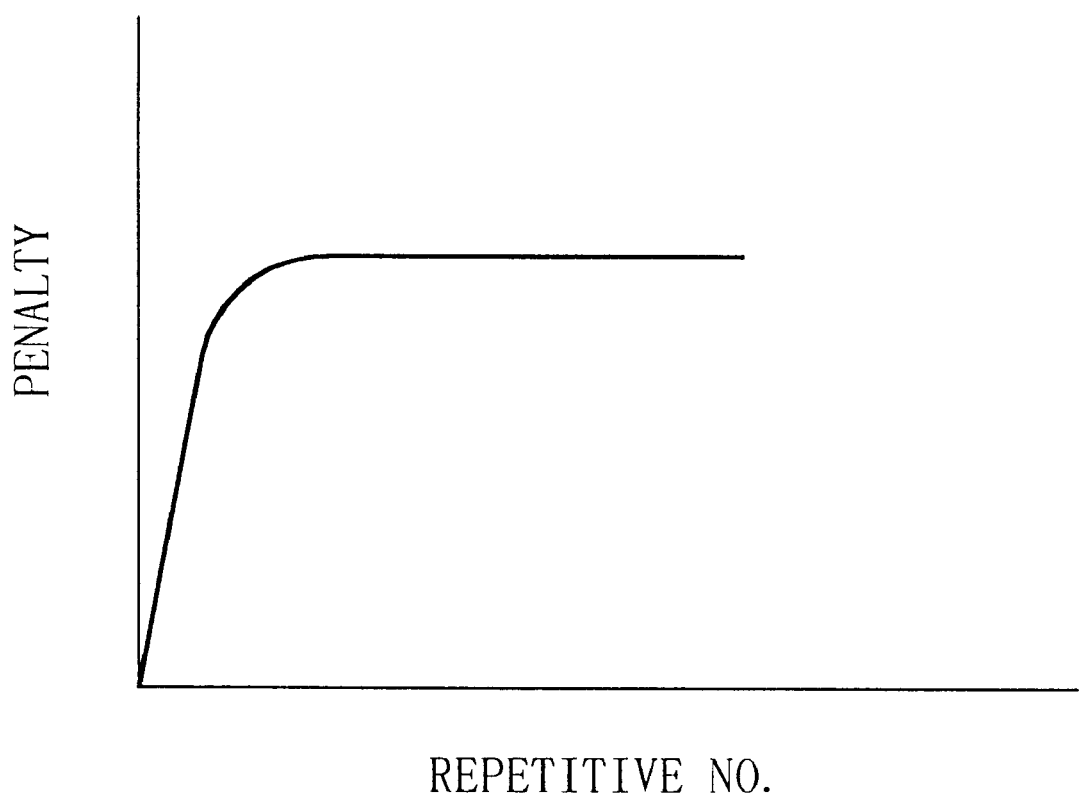
FIG. 23 is a graph illustrating the relationship between a repetitive number of processes and a penalty for failing to satisfy a height constraint in accordance with the wiring route search method of the fourth embodiment.
Figure 24:
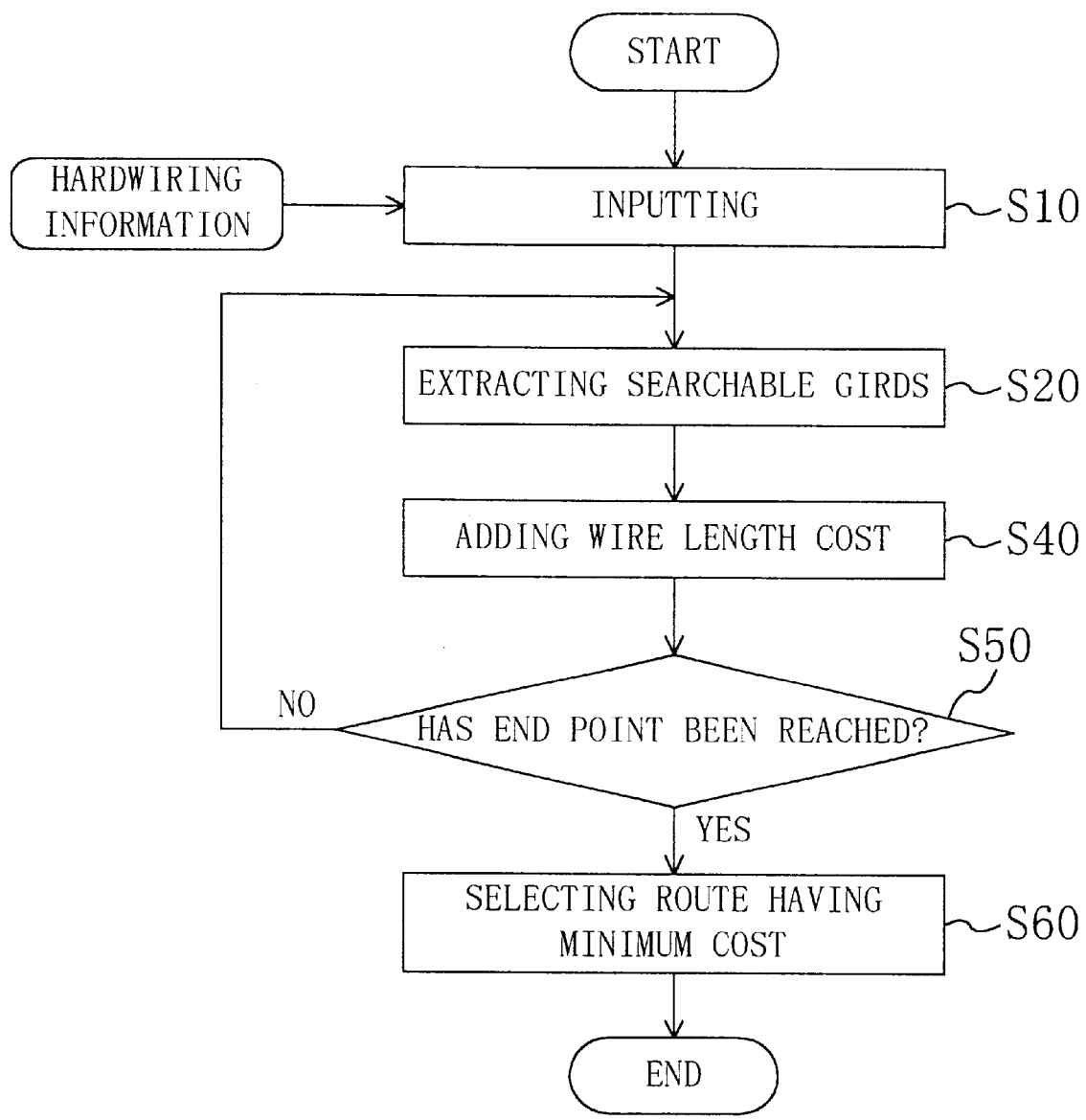
FIG. 24 is a flow chart illustrating the processing procedure of a conventional wiring route search method.
Figure 25:
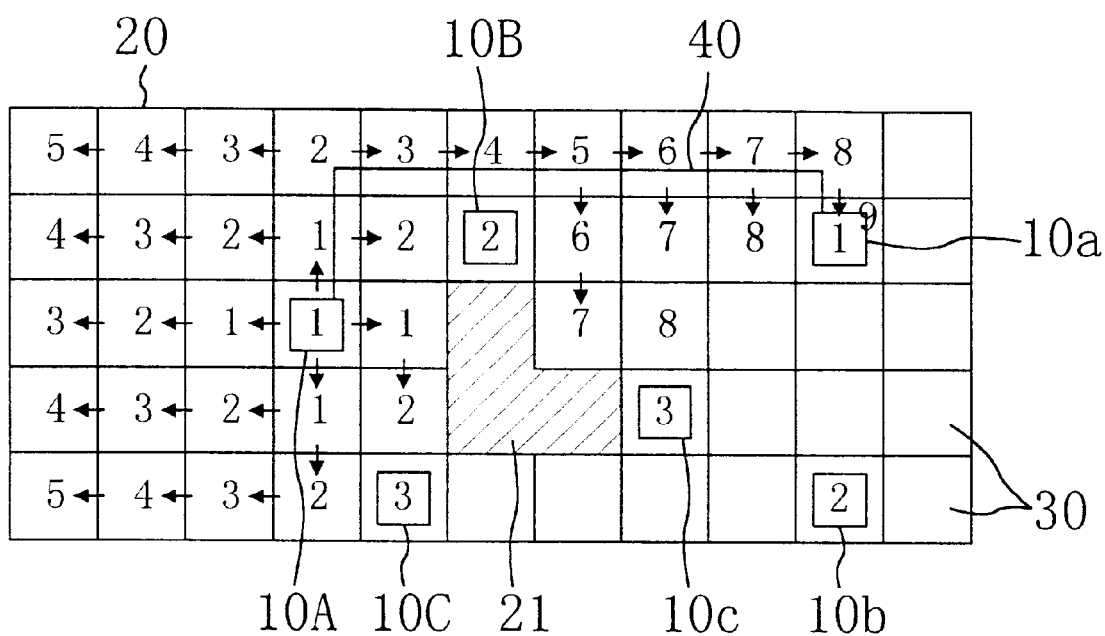
FIG. 25 is a diagram illustrating an intermediate processing stage of the conventional wiring route search method.
Figure 26A:
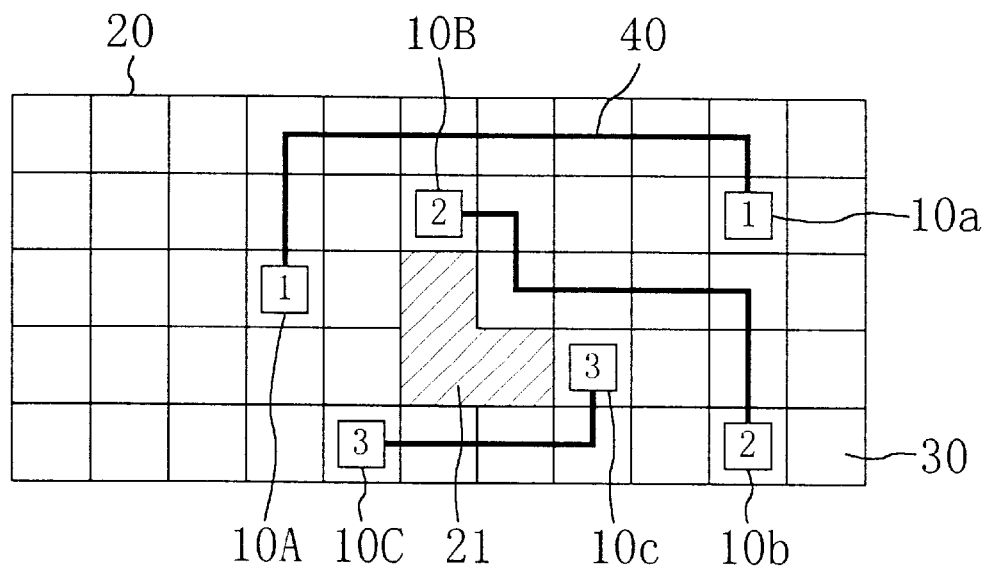
FIG. 26(a) is a diagram illustrating the results of routing in accordance with the conventional wiring route search method.
Figure 26B:
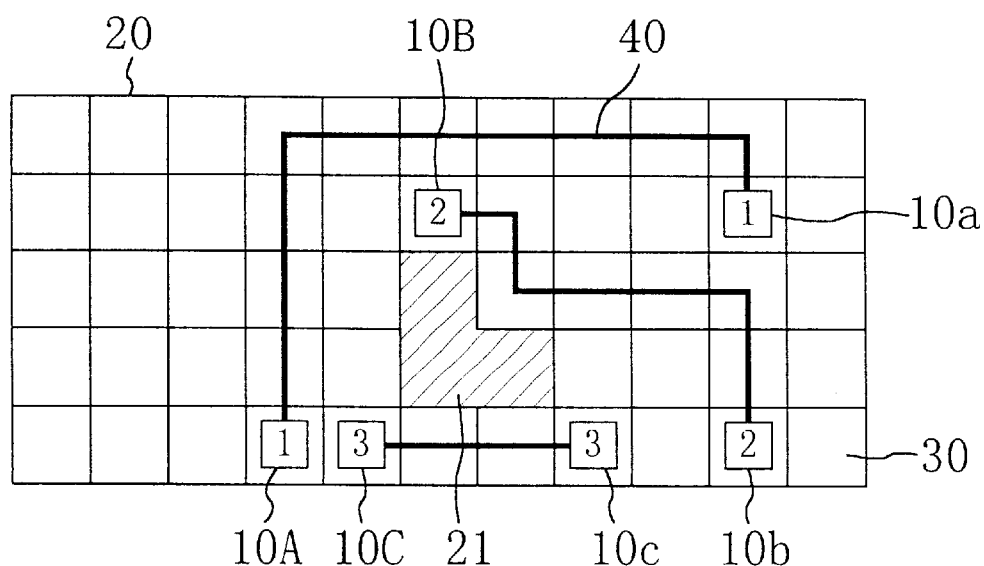
FIG. 26(b) is a diagram illustrating the results obtained by compacting the results shown in FIG. 26(a).
Figure 27:
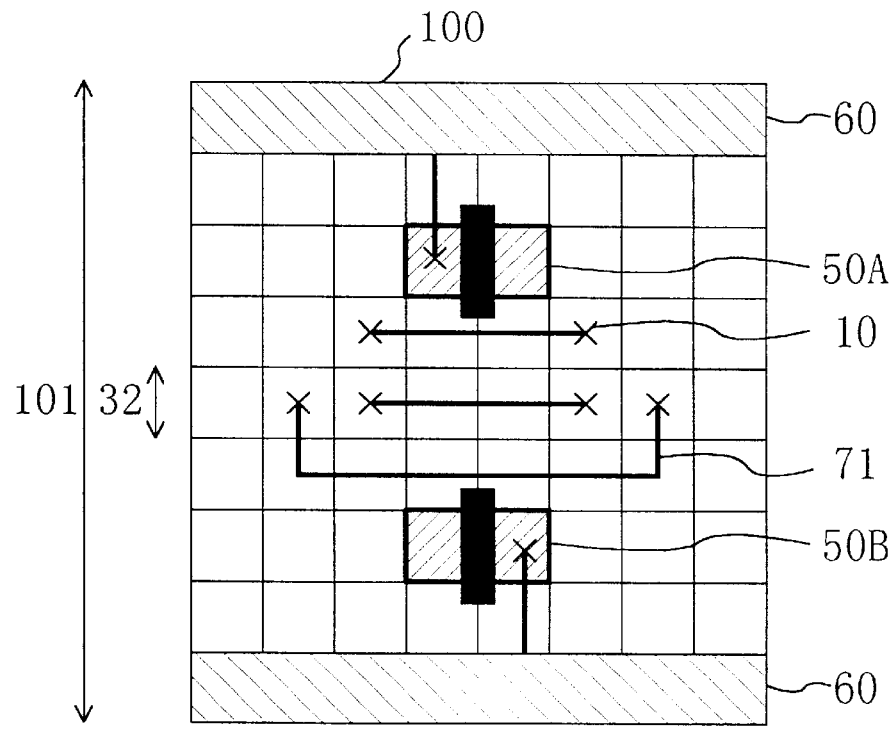
FIG. 27 is a diagram illustrating the results obtained by routing and designing a standard cell using grids uniformly divided with a routing pitch in the conventional wiring route search method.
Figure 28:
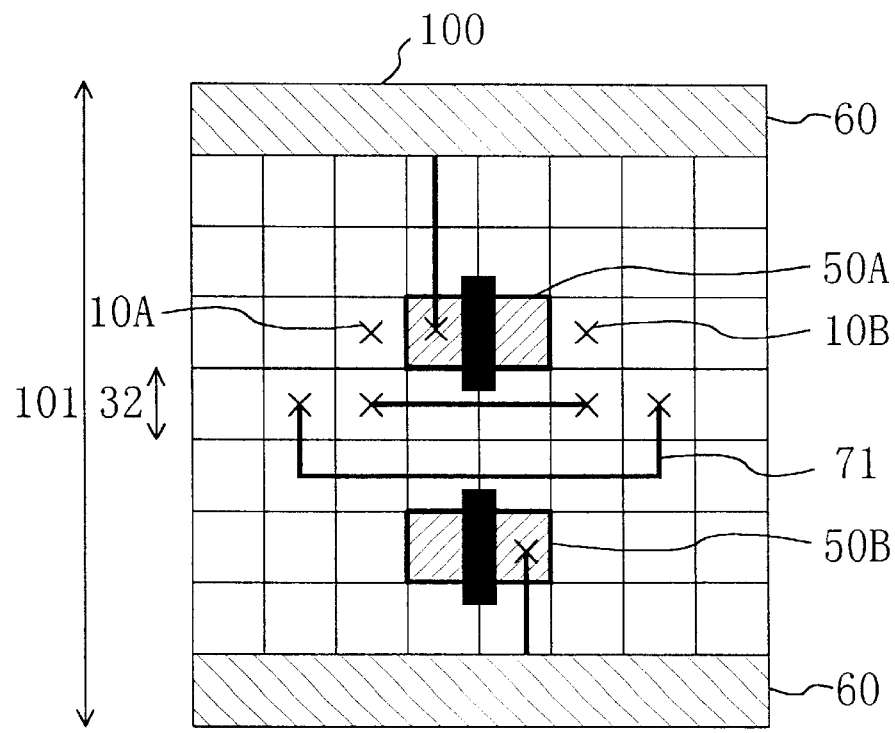
FIG. 28 is a diagram illustrating an example in which routing cannot be completed because of shortage in number of grids in the conventional wiring route search method.
Figure 29:
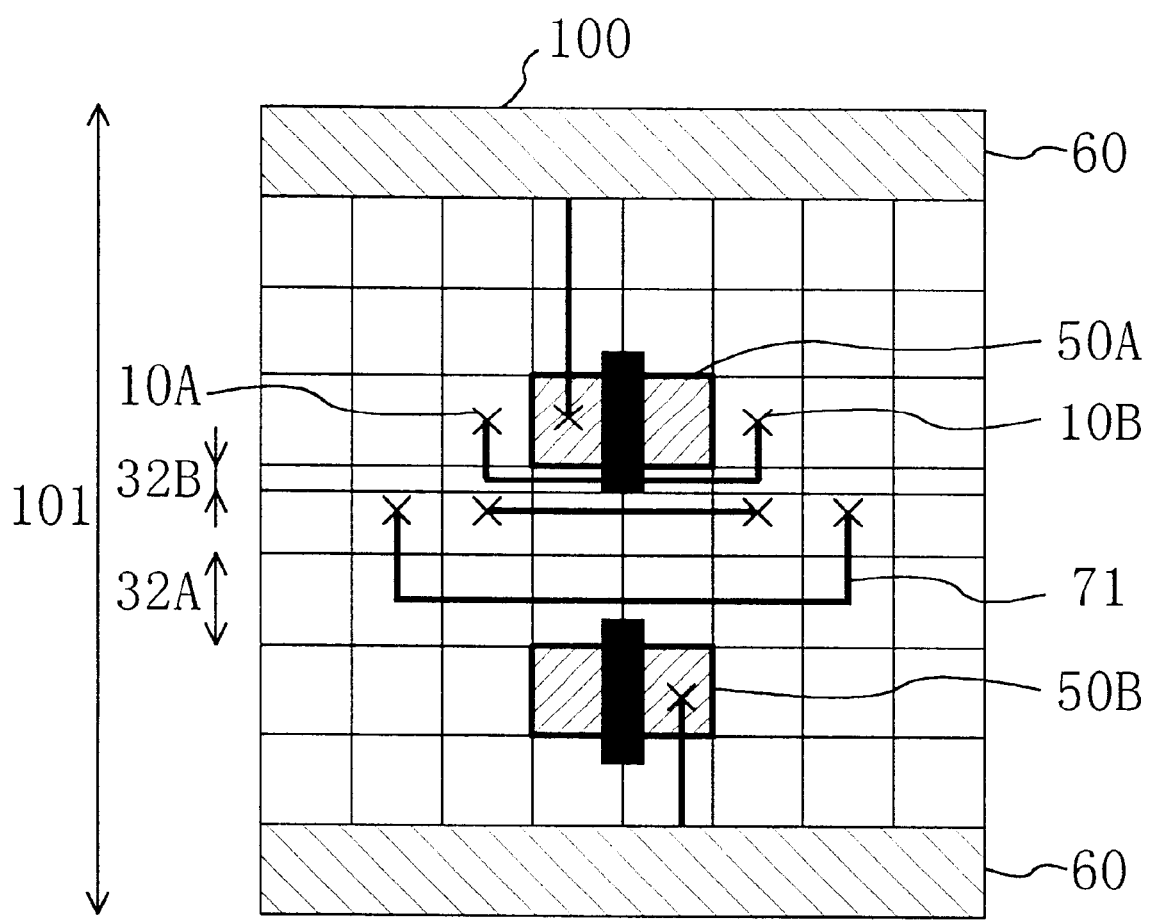
FIG. 29 is a diagram illustrating an example in which routing is completed by providing grids having a height narrower than the routing pitch in the conventional wiring route search method.

FIG. 23 illustrates this Equation 11 as a graph.

In this embodiment, the penalty p is gradually increased from a smaller value to a larger value. Alternatively, the penalty may be gradually decreased from a larger value to a smaller value.

Also, in this embodiment, Step S300 of searching for a wiring route is repeatedly performed for all the nets. Alternatively, the same results can be attained if the step of searching for the wiring route is selectively performed only for some of the nets causing the height constraint errors.

In the first and fourth embodiments, a height constraint in the vertical direction is given. Alternatively, the present invention is also applicable to a case of giving a lateral width constraint in the horizontal direction, which can be satisfied by calculating the numbers of available grids for rows of grids in the horizontal direction.

What is claimed is:

1. An automatic routing method for routing and designing an LSI, the method comprising the steps of:
   a) initial routing of a net;
   b) removing a wire already routed if a design rule error exists in the wire or a non-routable wire is caused as a result of the initial routing; and
   c) if the wire already routed and removed is a wire interconnecting a movable terminal, freely placeable within a predetermined region, to another terminal placed within a wiring region,
   displacing the movable terminal to a newly generated and previously unoccupied position within the predetermined region and re-routing the removed wire such that the displaced movable terminal is interconnected to the another terminal.

2. The method of claim 1, wherein the movable terminal is a source/drain terminal of a MOSFET.

3. The method of claim 1, wherein in the predetermined region where the movable terminal is placed, an area where the movable terminal is placed and the other areas of the region are all routable areas.

4. The method of claim 1, wherein the step a) comprises the steps of:
   d) defining the predetermined region where the movable terminal is placeable; and
   e) determining an initial position of the movable terminal in the defined, predetermined region.

5. The method of claim 1, wherein in the step b), the wire already routed and to be removed is extracted by regarding the number of the movable terminals as an index of evaluation.

6. The method of claim 1, wherein the step a) is performed without taking into consideration a design rule error caused by a wire already routed.

7. The method of claim 1, wherein the step a) is performed without allowing a design rule error to happen with a wire already routed.

8. A method for searching for a wiring route during automatically routing and designing an LSI in accordance with a maze algorithm in which a wiring route cost is calculated by adding a cost every time a single grid is passed in a wiring region divided into a plurality of grids,
   the method comprising the steps of:
   a) inputting at least one of a height constraint and a lateral width constraint of the wiring region and hardwiring information;
   b) calculating a number of available grids for each column of grids, on which the height constraint of the wiring region is applied, or each row of grids, on which the lateral width constraint of the wiring region is applied, during routing based on the hardwiring information; and
   c) setting a passage cost for one of the columns of grids or one of the rows of grids, to which column or row the wiring route to be searched for proceeds, based on the number of available grids calculated for the column or the row, and adding the passage cost to the wiring route cost.

9. The method of claim 8, wherein in the step b), the number of available grids is calculated by subtracting a size of a wiring forbidden region in each said column or row of grids and a total size of wires already assigned to the column or row of grids from the height or lateral width constraint of the wiring region.

10. The method of claim 8 or 9, further comprising the step of d) extracting a wiring route having a minimum wiring route cost.

11. The method of claim 8 or 9, wherein in the step c), the passage cost is set based on not only the number of available grids but also a penalty for failing to satisfy the height or lateral width constraint.

12. The method of claim 11, further comprising the steps of:
   d) repeatedly searching for the wiring route if the height or lateral width constraint of the wiring region has not been satisfied after all the routes have been searched; and
   e) changing the penalty for failing to satisfy the height or lateral width constraint every time the wiring route is repeatedly searched.

13. The method of claim 12, wherein in the step e), the penalty is gradually changed from a smaller value to a larger value.

* * * * *